(12) United States Patent
Park et al.

(10) Patent No.: US 12,287,743 B2
(45) Date of Patent: Apr. 29, 2025

(54) SEMICONDUCTOR SYSTEM

(71) Applicant: Samsung Electronics Co., Ltd., Suwon-si (KR)

(72) Inventors: Hyun Jun Park, Seoul (KR); Woo-Seok Choi, Seoul (KR)

(73) Assignees: SAMSUNG ELECTRONICS CO., LTD., Suwon-si (KR); UIF (University Industry Foundation), Yonsei University, Seoul (KR)

( * ) Notice: Subject to any disclaimer, the term of this patent is extended or adjusted under 35 U.S.C. 154(b) by 57 days.

(21) Appl. No.: 18/215,036

(22) Filed: Jun. 27, 2023

(65) Prior Publication Data

US 2024/0086342 A1    Mar. 14, 2024

(30) Foreign Application Priority Data

Sep. 14, 2022 (KR) .................. 10-2022-0115813
Dec. 28, 2022 (KR) .................. 10-2022-0187703

(51) Int. Cl.

| | |
|---|---|
| *G06F 13/16* | (2006.01) |
| *G06F 13/20* | (2006.01) |
| *G11C 7/02* | (2006.01) |
| *G11C 7/10* | (2006.01) |
| *H03F 1/32* | (2006.01) |
| *H03F 3/45* | (2006.01) |
| *H03K 17/687* | (2006.01) |

(52) U.S. Cl.
CPC .......... *G06F 13/1668* (2013.01); *G06F 13/20* (2013.01); *G11C 7/1006* (2013.01); *H03K 17/6871* (2013.01); *G06F 2213/16* (2013.01); *G06F 2213/40* (2013.01); *G11C 7/106* (2013.01); *H03F 3/45179* (2013.01)

(58) Field of Classification Search
CPC ....... G11C 7/1057; G11C 7/1006; G11C 7/02; G11C 7/106; H03K 7/6871; G06F 13/20; G06F 13/1668; G06F 2213/16; G06F 2213/40; H03F 3/45766; H03F 1/3211; H03F 3/45179; H03F 2203/45306; H03F 2203/45381; H03F 2203/45311
USPC ........................................................ 710/33
See application file for complete search history.

(56) References Cited

U.S. PATENT DOCUMENTS

| | | |
|---|---|---|
| 8,879,182 B2 | 11/2014 | Haratsch et al. |
| 10,348,364 B2 | 7/2019 | Giraldo et al. |
| 11,336,302 B2 | 5/2022 | Shokrollahi et al. |
| 2006/0115091 A1 | 6/2006 | Kim et al. |

(Continued)

FOREIGN PATENT DOCUMENTS

KR         100608024 B1    8/2006

*Primary Examiner* — Chun Kuan Lee
(74) *Attorney, Agent, or Firm* — Muir Patent Law, PLLC

(57) ABSTRACT

A semiconductor system including a transmitter configured to output a plurality of data as a plurality of data input/output signals through a plurality of channels based on a matrix E, and a receiver configured to generate the plurality of data by differentially amplifying the plurality of data input/output signals received through the plurality of channels based on a matrix D, in which all components of the matrix E and the matrix D are integers, a product matrix of the matrix D and the matrix E is a diagonal matrix, a sum of the components of each row of the matrix D is 0, and a sum of absolute values of the components of each column of the matrix D is less than or equal to a threshold value.

20 Claims, 18 Drawing Sheets

(56) References Cited

U.S. PATENT DOCUMENTS

| | | | |
|---|---|---|---|
| 2008/0198909 A1* | 8/2008 | Tsatsanis | H04L 25/03012 375/350 |
| 2013/0251141 A1* | 9/2013 | Mermans | H04B 3/32 379/406.06 |
| 2021/0288740 A1 | 9/2021 | Shokrollahi et al. | |
| 2022/0173883 A1 | 6/2022 | Ulrich et al. | |
| 2022/0200606 A1 | 6/2022 | Tajalli et al. | |

* cited by examiner

SEMICONDUCTOR SYSTEM

CROSS-REFERENCE TO RELATED APPLICATION

This application claims priority to and the benefit of Korean Patent Application No. 10-2022-0115813 filed in the Korean Intellectual Property Office on Sep. 14, 2022, and Korean Patent Application No. 10-2022-0187703 filed in the Korean Intellectual Property Office on Dec. 28, 2022, the entire contents of which are incorporated herein by reference.

BACKGROUND

(1) Field

The present disclosure relates to a semiconductor system.

(2) Description of the Related Art

To provide a high-speed input/output (I/O) interface, a transmitter/receiver may transmit and receive signals using a single-ended signaling method or a differential signaling method. Since the number of signal pins and signal lines required to implement the single-ended signaling is smaller than the number of signal pins and signal lines required to implement the differential signaling, the single-ended signaling method occupies a small area in a semiconductor device. However, the single-ended signaling method may cause noise (e.g. SSN simultaneous switching output induced noise) by a current flowing in a parasitic inductor when multiple single-ended ports on a transmitter are switching in the same direction at the same time, thereby increasing jitter of an output driver. In addition, the single-ended signaling method may be affected by a transition of adjacent signal lines, and thus, crosstalk may occur due to an instantaneous change of a transition position.

SUMMARY

Aspects of the present disclosure provide a semiconductor system having advantages of preventing signal deterioration due to SSN.

Aspects of the present disclosure provide a semiconductor system having advantages of reducing crosstalk between adjacent signal lines.

According to an aspect of an example embodiment, a semiconductor system includes a transmitter configured to output a plurality of data as a plurality of data input/output signals through a plurality of channels based on matrix E, and a receiver configured to generate the plurality of data by differentially amplifying the plurality of data input/output signals received through the plurality of channels based on matrix D, in which all components of the matrix E and the matrix D are integers, a product matrix of the matrix D and the matrix E is a diagonal matrix, a sum of the components of each row of the matrix D is 0, and a sum of absolute values of the components of each column of the matrix D is less than or equal to a threshold value.

According to an aspect of an example embodiment, a memory device, includes a memory cell array and a transmitter configured to receive n (n is a natural number) data from the memory cell array, and emphasizes the n data with intensities according to components of a matrix E to generate n+1 data input/output signals, in which a sum of the components of the matrix E is 0.

According to an aspect of an example embodiment, a memory system includes a memory device configured to include a memory cell array and a transmitter encoding n data into n+1 data input/output signals and outputting the n+1 data input/output signals, and a memory controller configured to include a receiver receiving the n+1 data input/output signals and decoding n data by differentially amplifying the n+1 data input/output signals according to components of matrix D, in which a sum of the components of the matrix D is 0.

DETAILED DESCRIPTION OF THE EMBODIMENTS

Figure 1:
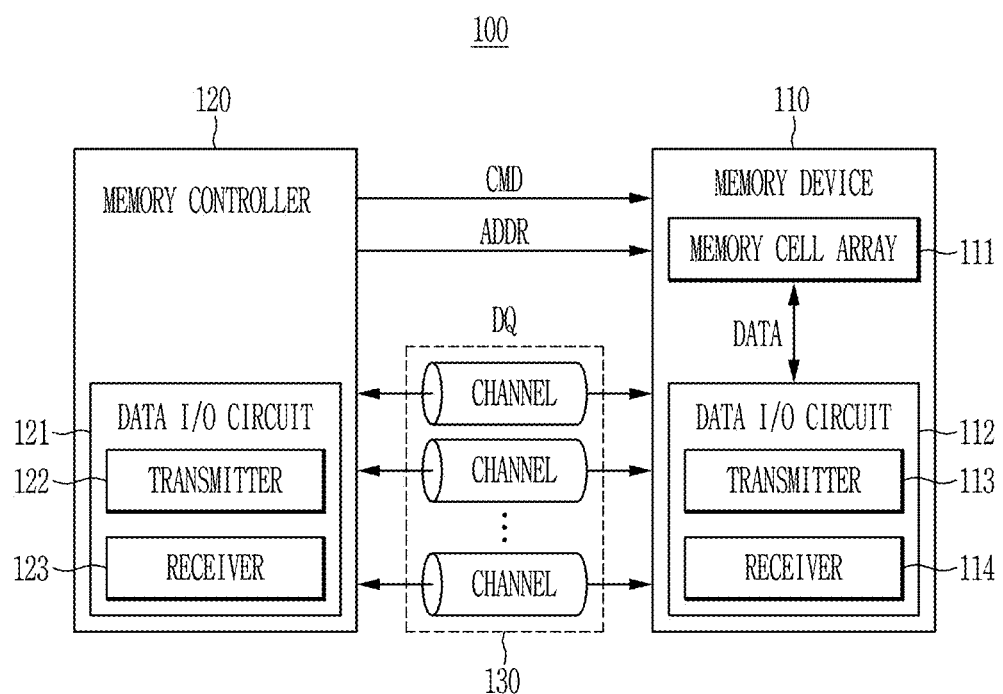
FIG. 1 is a block diagram of a memory system according to an example embodiment.

In the following detailed description, only certain example embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In flowcharts described with reference to the drawings, an order of operations may be changed, several operations may be merged, some operations may be divided, and specific operations may not be performed.

In addition, an expression written in singular may be construed in singular or plural unless an explicit expression such as "one" or "single" is used. Terms including an ordinal number such as first, second, etc., may be used to describe various components, but the components are not limited to these terms. These terms may be used for the purpose of distinguishing one component from other components.

FIG. 1 is a block diagram of a memory system according to an example embodiment.

Referring to FIG. 1, a memory system 100 includes a memory device 110 and a memory controller 120. In some example embodiments, the memory device 110 and the memory controller 120 may be connected through a memory interface to exchange signals through the memory interface.

The memory device 110 includes a memory cell array 111 and a data input/output circuit (data I/O circuit) 112. The memory cell array 111 includes a plurality of memory cells connected to a plurality of rows and a plurality of columns. The data I/O circuit 112 may store data transferred from an outside (i.e., the memory controller 120, etc.) of the memory device 110 in the memory cell array 111 or output data stored in the memory cell array 111 to the outside of the memory device 110. The data I/O circuit 112 may include a transmitter 113 and a receiver 114. The transmitter 113 may receive data DATA from the memory cell array 111 and output a data input/output signal DQ based on the data DATA. The transmitter 113 may output DQ in parallel through channels 130. When the DQ is output to the channels 130 in parallel, a transition may occur by signals in the channels 130. For example, when the transition occurs in channels adjacent to a target channel, signal transmission of the target channel may be interrupted. This phenomenon may be referred to as crosstalk. In some example embodiments, the transmitter 113 may transmit a signal in a single-ended signaling method. The receiver 123 may receive signals transmitted through the channels 130 from the transmitter 113 and determine bits of the transmitted signals by comparing the transmitted signals with a reference signal. According to the single-ended signaling method, when the DQ output from the transmitter 113 through the channels 130 simultaneously switches in the same direction, noise (e.g., simultaneous switching output induced noise (SSN)) may be induced by a current flowing in a parasitic inductor.

The transmitter 113 may output the DQ in which the data DATA is encoded. In some example embodiments, the transmitter 113 may output DQs having different levels of voltage to each of the channels 130 for one unit interval (UI). The transmitter 113 may output the DQ so that the sum total of voltage changes in channels 130 is substantially 0 between two consecutive UIs. As a result, the SSN of the channels 130 may be removed or reduced.

The transmitter 113 may output the DQ in which the data DATA is encoded, to each of the channels 130, based on a gain value determined according to the arrangement of the channels 130. The gain value may include a crosstalk component for removing an effect of a signal component of a channel and signal components of adjacent channels. Accordingly, it is possible to reduce crosstalk occurring between adjacent channels.

The transmitter 113 may output the DQ through a greater number of channels 130 than the number of bits in the DATA. In some example embodiments, the number of channels 130 may be greater than the number of bits of data DATA by one.

The channels 130 may be paths that physically or electrically connect the memory device 110 and the memory controller 120. For example, the channel 130 may be implemented using a through silicon via (TSV), a trace, or a coaxial cable.

The receiver 114 may receive the DQ provided from the memory controller 120 and decode the received DQ to generate the data DATA. The receiver 114 may output the generated data DATA to the memory cell array 111. Since the receiver 114 of the memory device 110 is substantially the same as the receiver 123 of the memory controller 120, the following description of the receiver 123 of the memory controller 120 will be referred to.

The memory controller 120 provides a signal to the memory device 110 to control a memory operation of the memory device 110. The signal may include a command CMD and an address ADDR. In some example embodiments, the memory controller 120 may provide the command CMD and the address ADDR to the memory device 110 to access the memory cell array 111 and control the memory operation such as reading or writing. Data is transmitted from the memory cell array 111 to the memory controller 120 as the DQ according to the read operation, and data may be transmitted from the memory controller 120 to the memory cell array 111 as the DQ according to a write operation.

The memory device 110 and the memory controller 120 may transmit and receive the DQ to and from each other by a serial interfacing method. The memory controller 120 may access the memory device 110 according to a request from an external host of the memory system 100. The memory controller 120 may communicate with the host using various protocols. For example, the memory controller 120 may communicate with the external host by a parallel interfacing method. In some example embodiments, the memory controller 200 may communicate with the host by the serial interfacing method.

The command CMD may include an activate command, a read/write command, and a refresh command. The activate command may be a command that converts a target row of the memory cell array 111 into an active state in order to write data to or read data from the memory cell array 111. Memory cells of the target row may be activated (e.g., driven) in response to the activate command. The read/write command may be a command for performing the read or write operation on the target memory cell of the row converted into the active state. The refresh command may be a command for performing the refresh operation in the memory cell array 111.

The data I/O circuit 121 of the memory controller 120 may output data to the memory device 110 as the DQ or receive the DQ output from the memory device 110. The data I/O circuit 121 may include a transmitter 122 and a receiver 123. The transmitter 122 may transmit data provided from the external host to the memory device 110. Since the transmitter 122 of the memory controller 120 is substantially the same as the transmitter 113 of the memory device 110, the above description of the transmitter 113 of the memory device 110 will be referred to. The receiver 123 may receive the DQ and decode the received DQ. In an example embodiment, the receiver 123 may generate one data bit based on the plurality of DQs transmitted from the plurality of channels 130. For example, the receiver 123 may restore 1-bit data of the data DATA based on two DQs transmitted from two of the channels 130.

The memory device 110 may be a storage device based on a semiconductor device. In some example embodiments, the memory device 110 may include a dynamic random access memory (DRAM) device. In some example embodiments, the memory device 110 may include another volatile or non-volatile memory device in which the transmitter 113 or the receiver 114 is used.

Hereinafter, the data I/O circuit 112 of the memory device 110 will be described with reference to FIGS. 2 to 4. However, hereinafter, the description of the data I/O circuit 112 of the memory device 110 may be equally applied to the data I/O circuit 121 of the memory controller 120.

Figure 2:
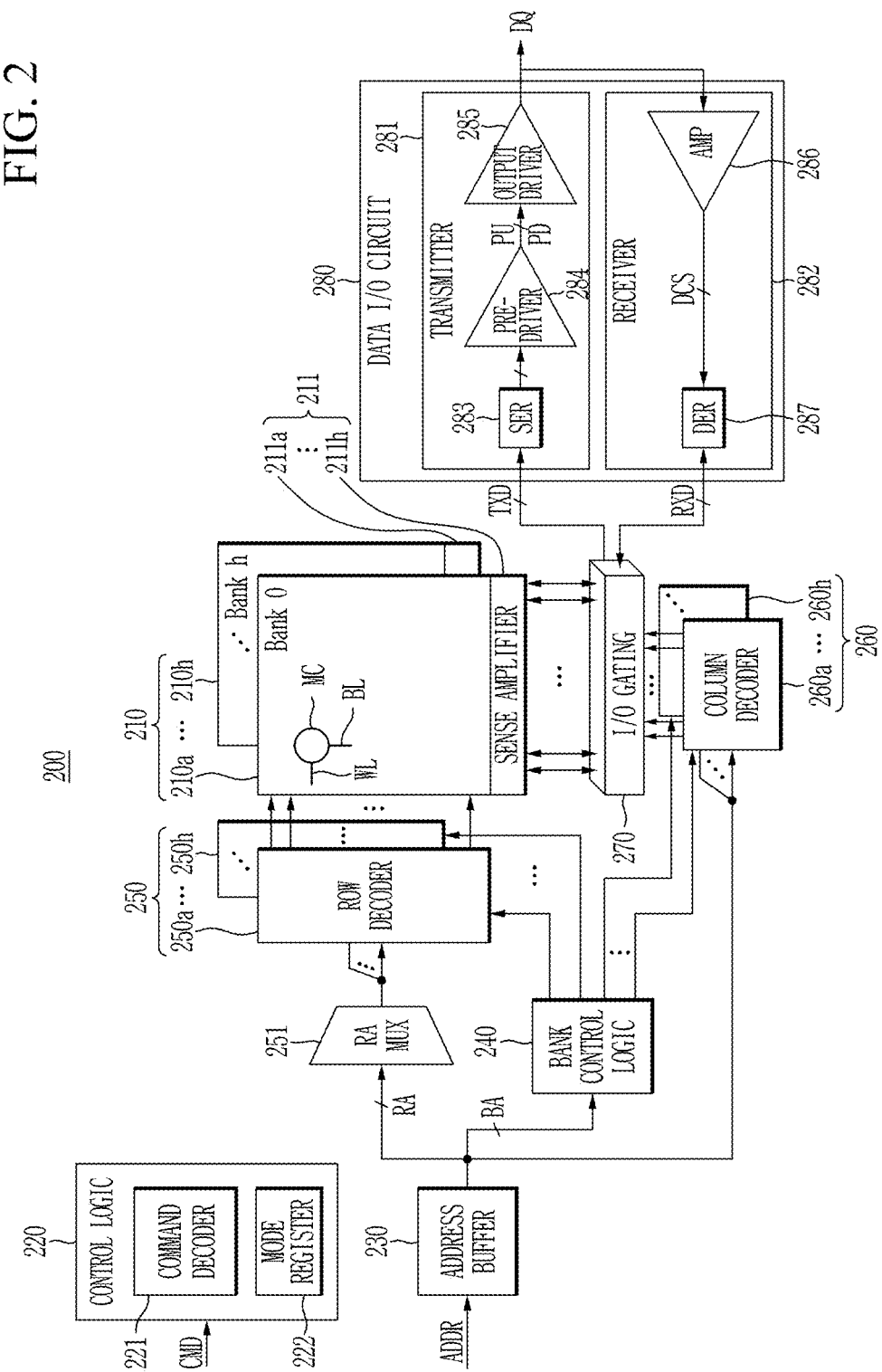
FIG. 2 is a block diagram of a memory device according to an example embodiment.

FIG. 2 is a block diagram of a memory device according to an example embodiment.

Referring to FIG. 2, the memory device 200 includes a memory cell array 210, a sense amplifier 211, a control logic circuit 220, an address buffer 230, a row decoder 250, a column decoder 260, an I/O gating circuit 270, and a data I/O circuit 280.

The memory cell array 210 includes a plurality of memory cells MC. In some example embodiments, the memory cell array 210 may include a plurality of memory banks 210a to 210h. Although eight memory banks BANK0 to BANKh 210a to 210h are shown in FIG. 2, the number of memory banks is not limited thereto. Each of the memory banks 210a to 210h may include a plurality of rows, a plurality of columns, and a plurality of memory cells MC arranged at intersections of the plurality of rows and the plurality of columns. In some example embodiments, the plurality of rows may be defined by a plurality of word lines WL, and the plurality of columns may be defined by a plurality of bit lines BL.

The control logic circuit 220 controls the operation of the memory device 200. For example, the control logic circuit 220 may generate a control signal to allow the memory device 200 to perform the read operation, the write operation, an offset calibration operation, and the like. In some example embodiments, the control logic circuit 220 may include a command decoder 221. The command decoder 221 may generate a control signal by decoding the command CMD received from the memory controller (e.g., 120 of FIG. 1). In some example embodiments, the control logic circuit 220 may further include a mode register 222 for setting an operating mode of the memory device 200.

The address buffer 230 receives the address ADDR provided from the memory controller 120. The address ADDR includes a row address RA indicating a row of the memory cell array 210 and a column address CA indicating a column of the memory cell array 210. The row address RA is provided to the row decoder 250 and the column address CA is provided to the column decoder 260. In some example embodiments, the memory device 200 may further include a row address multiplexer 251. The row address RA may be provided to the row decoder 250 through the row address multiplexer 251. In some example embodiments, the address ADDR may further include a bank address BA indicating a memory bank. The bank address BA may be provided to the bank control logic 240.

In some example embodiments, the memory device 200 may further include a bank control logic 240 that generates a bank control signal in response to the bank address BA. The bank control logic 240 may activate the row decoder 250 corresponding to the bank address BA among the plurality of row decoders 250 in response to the bank control signal, and activate the column decoder 260 corresponding to the bank address (BA) among the plurality of column decoders 260.

The row decoder 250 selects a row to be activated from among the plurality of rows of the memory cell array 210 based on the row address. To this end, the row decoder 250 may apply a driving voltage to a word line corresponding to the row to be activated. In some example embodiments, a plurality of row decoders 250a to 250h corresponding to the plurality of memory banks 210a to 210h may be provided.

The column decoder 260 selects a column to be activated from among the plurality of columns of the memory cell array 210 based on the column address. To this end, the column decoder 260 may activate the sense amplifier 211 corresponding to the column address CA through the I/O gating circuit 270. In some example embodiments, a plurality of column decoders 260a to 260h respectively corresponding to the plurality of memory banks 210a to 210h may be provided. In some example embodiments, the I/O gating circuit 270 may gate input and output data, and include a data latch for storing data read from the memory cell array 210 and a write driver for writing data to the memory cell array 210. Data read from the memory cell array 210 may be detected by the sense amplifier 211 and stored in the I/O gating circuit 270 (e.g., a data latch). In some example embodiments, a plurality of sense amplifiers 211a to 260h respectively corresponding to the plurality of memory banks 210a to 210h may be provided.

In some example embodiments, the data (e.g., data stored in the data latch) read from the memory cell array 210 may be provided to the memory controller 120 through the data I/O circuit 280. The data to be written in the memory cell array 210 may be provided to the data I/O circuit 280 from the memory controller 120, and the data provided to the data I/O circuit 280 may be provided to the I/O gating circuit 270.

The data I/O circuit 280 may either output the DQ or receive the DQ. The data I/O circuit 280 may include a transmitter 281 and a receiver 282. The transmitter 281 may encode data TXD transmitted from the I/O gating circuit 270 and output the encoded data TXD as the DQ. The receiver 282 may decode the received DQ and transmit data RXD based on the decoded signal to the I/O gating circuit 270.

In an example embodiment, the transmitter 281 may include a serializer (SER) 283, a pre-driver 284, and an output driver 285. The serializer 283 may convert the parallel data TXD transmitted from the I/O gating circuit 270 into serial data. For example, the serializer 283 may be an i:j serializer that converts i-bit parallel data (TXD) into j-bit serial data (where i and j are positive numbers and i>j). The pre-driver 284 may generate a pull-up control signal PU and a pull-down control signal PD based on the serial data. In some example embodiments, the pre-driver 284 may generate a logic "low" level pull-up control signal PU and a logic "high" level pull-down control signal PD when the logic value of the serial data is the logic "low" level, and generate a logic "high" level pull-up control signal PU and a logic "low" level pull-down control signal PD when the logic value of the serial data is the logic "high" level. The output driver 285 may receive the pull-up control signal PU and the pull-down control signal PD and output the received pull-up control signal PU and pull-down control signal PD as the DQ which is an analog signal. In some example embodiment, the output driver 285 may generate one DQ based on the plurality of pull-up control signals PU and the plurality of pull-down control signals PD generated in response to the plurality of bit data of serial data. For example, the output driver 285 may generate one DQ output to one channel by using the pull-up control signal PU and the plurality of pull-down control signals PD generated based on the first bit data of the serial data and the pull-up control signal PU and the plurality of pull-down control signals PD generated based on the second bit data. In some example embodiments, the DQ may have a voltage level of the number of channels. For example, when the number of channels is 8, the voltage level of the DQ may be 8. In some example embodiments, the transmitter 281 may further include an equalizer (not illustrated) that performs equalization to compensate for DQ distortion.

In an example embodiment, the receiver 282 may include an amplifier 286 and a deserializer (DES) 287. The amplifier 286 may amplify and sample the DQ to generate a decoded signal DCS. In some example embodiments, the amplifier 286 may have input impedance for impedance matching with the transmitter (122 in FIG. 1). In some example embodiments, the receiver 282 may further include the equalizer (not illustrated) that performs the equalization to compensate for the DQ distortion. The deserializer 287 may receive the decoded signal DCS and convert the received decoded signal DCS into the received data RXD.

Next, referring to FIG. 3, the output driver 285 of the transmitter 281 according to an example embodiment will be described in detail.

Figure 3:
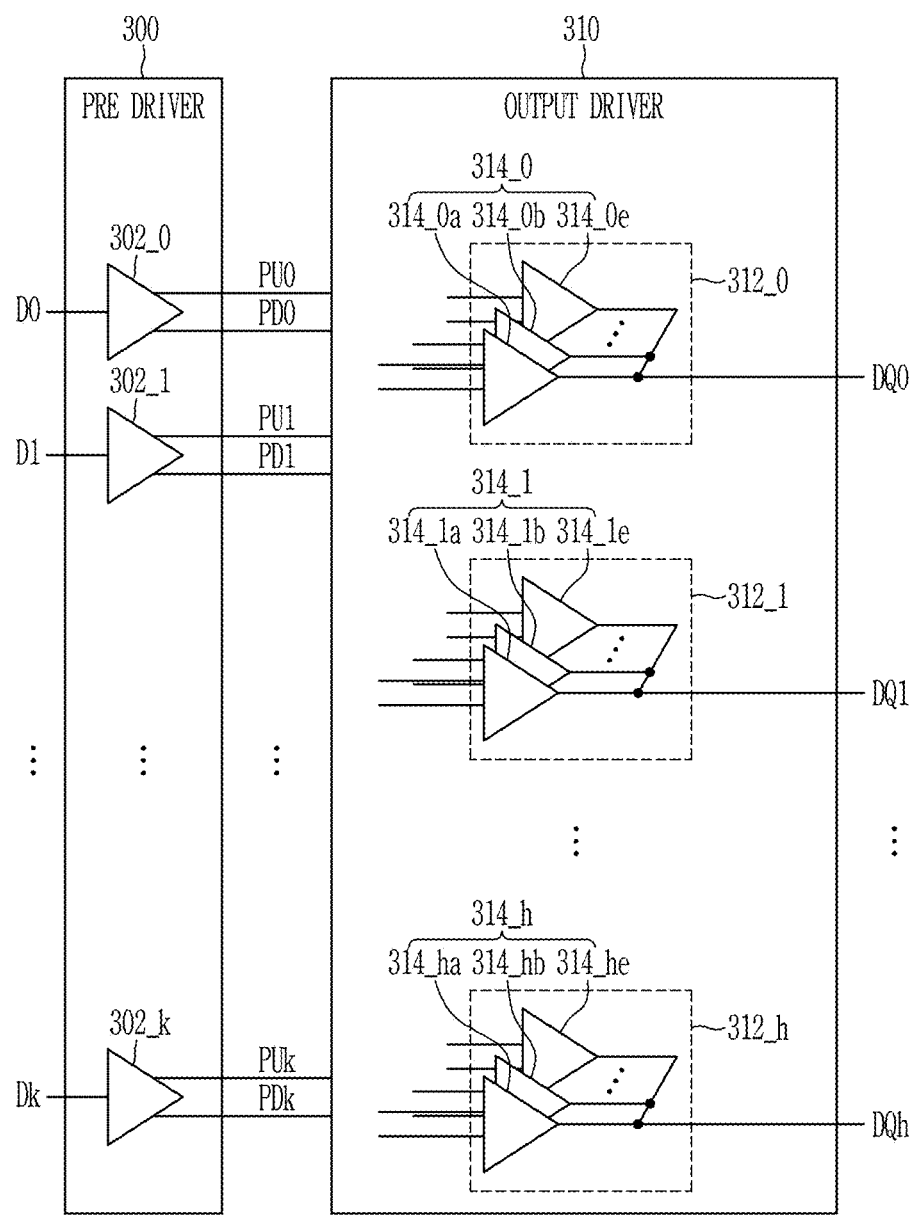
FIG. 3 is a block diagram illustrating a portion of a transmitter according to an example embodiment.

FIG. 3 is a block diagram illustrating a portion of a transmitter according to an example embodiment.

Referring to FIG. 3, a pre-driver 300 may correspond to the pre-driver 284 in FIG. 2. The pre-driver 300 may receive data D0, D1, . . . , Dk, and generate a plurality of pull-up control signals PU0, PU1, . . . , PUk and a plurality of pull-down control signals PD0, PD1, . . . , PDk based on logic values of data D0, D1, . . . , Dk. The pre-driver 300 may include a plurality of drivers 302_0, 302_1, and 302_k. Each of the plurality of drivers 302_0, 302_1, and 302_k may receive the data D0, D1, . . . , Dk, and output the pull-up control signals PU0, PU1, . . . , PUk, and the pull-down control signals PD0, PD1, . . . , PDk.

The output driver 310 may receive the plurality of pull-up control signals PU0, PU1, . . . , PUk and the plurality of pull-down control signals PD0, PD1, . . . , PDk. The output driver 310 may output the data input and output signals DQ0, DQ1, . . . , DQh based on the plurality of pull-up control signals PU0, PU1, . . . , PUk and the plurality of pull-down control signals PD0, PD1, . . . , PDk.

In an example embodiment, the output driver 310 may include a plurality of output modules 312_0, 312_1, and 312_h. Each of the plurality of output modules 312_0, 312_1, and 312_h may receive two or more pull-up control signals among the plurality of pull-up control signals PU0, PU1, . . . , PUk, and receive two or more pull-down control signals among the plurality of pull-down control signals PD0, PD1, . . . , PDk. Each of the plurality of output modules 312_0, 312_1, and 312_h may output a corresponding one of the data input/output signals DQ0, DQ1, . . . , DQh.

In an example embodiment, the plurality of output modules 312_0, 312_1, and 312_h may include a plurality of driver groups 314_0, 314_1, . . . , and 314_h. For example, the output module 312_0 may include a plurality of drivers 314_0a, 314_0b, . . . , 314_0e. Each of the plurality of drivers 314_0a, 314_0b, . . . , 314_0e may receive a corresponding one of two or more pull-up control signals and a corresponding one of two or more pull-down control signals. The DQ0 may be output to output terminals of the plurality of drivers 314_0a, 314_0b, . . . , 314_0e by the pull-up control signal and the pull-down control signal. In some example embodiments, two or more drivers among the plurality of drivers 314_0a, 314_0b, . . . , 314_0e may receive the same pull-up control signal and pull-down control signal.

According to an example embodiment, the plurality of output modules 312_0, 312_1, and 312_h operate pull-up/pull-down operations by the pull-up control signals PU0, PU1, . . . , PUk and the pull-down control signals PD0, PD1, . . . , PDk based on data of different bits without a separate encoding process, thereby outputting the corresponding DQ.

Next, referring to FIG. 4, the amplifier 286 of the receiver 282 according to the example embodiment will be described in detail.

Figure 4:
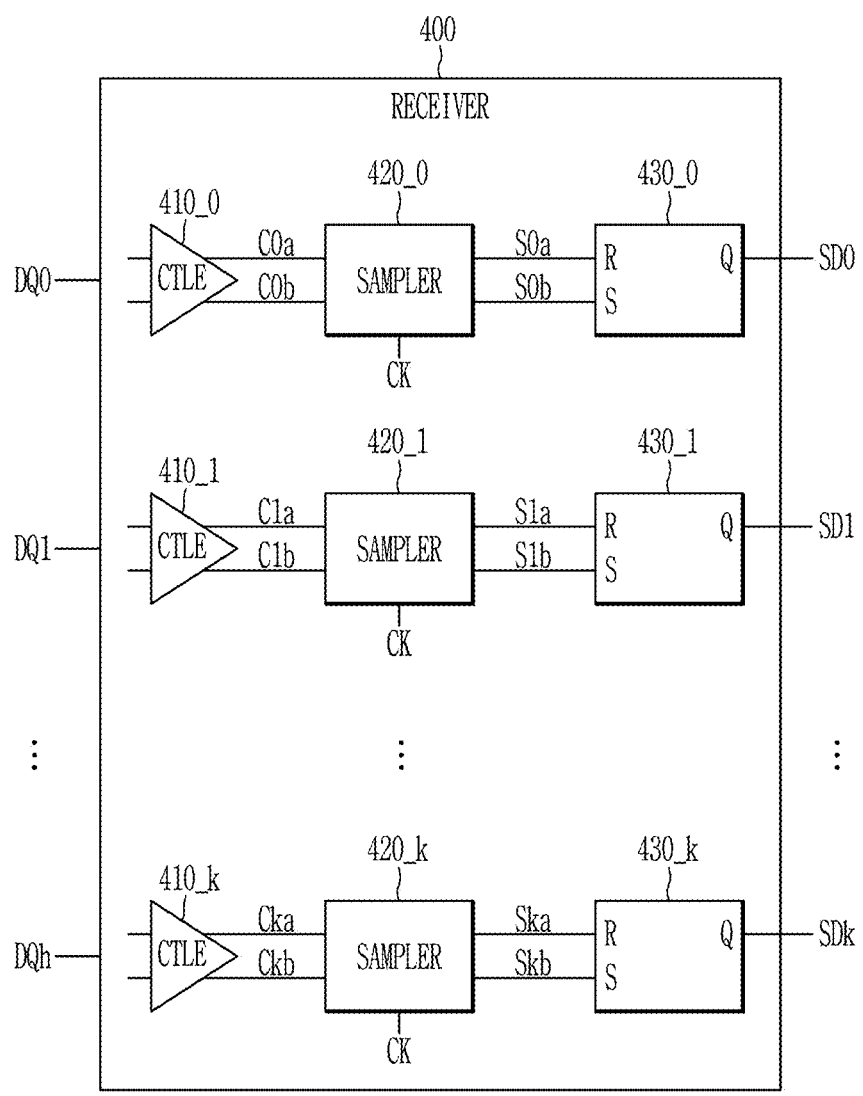
FIG. 4 is a block diagram of a receiver according to an example embodiment.

FIG. 4 is a block diagram of a receiver according to an example embodiment.

Referring to FIG. 4, a receiver 400 may correspond to the receiver 282 in FIG. 2. The receiver 400 may receive the plurality of data input/output signals DQ0, DQ1, . . . , DQh and output the decoded signals D0, D1, . . . , Dk. The receiver 400 may include a plurality of differential amplifiers 410_0, 410_1, . . . , 410_k, a plurality of sampler circuits 420_0, 420_1, . . . 420_k, and a plurality of SR latches 430_0, 430_1, . . . , 430_k.

The plurality of differential amplifiers 410_0, 410_1, . . . , 410_k may receive two or more data input/output signals among the plurality of data input/output signals DQ0, DQ1, . . . , DQh. Each of the plurality of differential amplifiers 410_0, 410_1, . . . , 410_k is configured to differentially amplify signals input to a first input terminal and a second input terminal. In some example embodiments, two or more differential amplifiers among the plurality of differential amplifiers 410_0, 410_1, . . . , 410_k may receive the same data input/output signal. The plurality of differential amplifiers 410_0, 410_1, . . . , 410_k may include analog signal processing circuits such as a continuous time linear equalizer (CTLE) and a pre-amplifier. For example, when the plurality of differential amplifiers 410_0, 410_1, . . . , 410_k are the CTLE, the plurality of differential amplifiers 410_0, 410_1, . . . , 410_k may remove/reduce channel distortion such as inter-symbol interference (ISI) and compensate for the channel distortion, and filter noise to output first and second differential output signals C0a and C0b, C1a and C1b, and Cka and Ckb.

The plurality of sampler circuits 420_0, 4201, . . . , 420_k may receive the first and second differential output signals C0a and C0b, C1a and C1b, and Cka and Ckb, and sample the first and second differential output signals C0a and C0b, C1a and C1b, and Cka and Ckb in synchronization with the input clock signal CK.

The plurality of SR latches 430_0, 430_1, . . . , 430_k may latch the sampled signals S0a and S0b, S1a and S1b, . . . , Ska and Skb and output the latched sampled signals S0a and S0b, S1a and S1b, . . . , Ska and Skb as sampling data SD0, SD1, . . . , SDk.

According to an example embodiment, the receiver 400 differentially amplifies two or more data input/output signals among the plurality of data input/output signals DQ0, DQ, . . . , DQh without a separate decoding process, thereby outputting the sampling data SD0, SD1, . . . , SDk.

The number of drivers of each of the plurality of driver groups 314_0, 314_1, . . . , 314_h in FIG. 3, the pull-up control signal and the pull-down control signal applied to the plurality of drivers 314_0, 314_1, . . . , 314_h, and the data input/output signals applied to the plurality of differential amplifiers 410_0, 410_1, . . . , 410_k in FIG. 4 may be determined according to the arrangement of the channels (130 in FIG. 1) and the number of bits of data to be transmitted during one UI period.

In FIG. 3, a relationship, as shown in Equation 1 below, is established between the data D0, D1, ..., Dk input to the pre-driver 300 and the signals DQ0, DQ1, ..., DQh output through the output driver 310.

$$\begin{bmatrix} DQ0 \\ DQ1 \\ \vdots \\ DQh \end{bmatrix} = E \times \begin{bmatrix} D0 \\ D1 \\ \vdots \\ Dk \end{bmatrix} \quad \text{(Equation 1)}$$

Here, the matrix E defines a rule for the output driver 310 to encode the data D0, D1, ..., Dk into the signals DQ0, DQ1, ..., DQh, and may be expressed as in Equation 2 below.

$$E = \begin{bmatrix} E00 & \cdots & E0k \\ \vdots & \ddots & \vdots \\ Eh0 & \cdots & Ehk \end{bmatrix} \quad \text{(Equation 2)}$$

The plurality of drivers 314_0, 314_1, ... 314_h outputting the signals DQ0, DQ1, ..., DQh, respectively, may receive the pull-up control signal and the pull-down control signal based on coefficients of the matrix E representing the signals DQ0, DQ1, ..., DQh, respectively, and the data D0, D1, ..., Dk. For example, the plurality of drivers 314_0a, 314_0b, ..., 314_0e that output the DQ0 may receive the corresponding pull-up control signal and pull-down control signals based on coefficients E00, ..., E0k of the matrix E representing the DQ0 and the data D0, D1, ..., Dk.

In FIG. 4, a relationship, as shown in Equation 3 below, is established between the signals DQ0, DQ1, ..., DQh input to the receiver 400 and the data SD0, SD1, ..., SDk output through the receiver 400.

$$\begin{bmatrix} SD0 \\ SD1 \\ \vdots \\ SDk \end{bmatrix} = D \times \begin{bmatrix} DQ0 \\ DQ1 \\ \vdots \\ DQh \end{bmatrix} \quad \text{(Equation 3)}$$

Here, matrix D defines a rule for the receiver 400 to restore the signals DQ0, DQ1, ..., DQh to the data SD0, SD1, ..., SDk, and may be expressed as in Equation 4 below.

$$D = \begin{bmatrix} D00 & \cdots & D0h \\ \vdots & \ddots & \vdots \\ Dk0 & \cdots & Dkh \end{bmatrix} \quad \text{(Equation 4)}$$

The differential amplifiers 410_0, 410_1, ... 410_k for outputting each of the data SD0, SD1, ..., SDk may receive the signals DQ0, DQ1, ..., DQh input to the first input terminal and the second input terminal based on the coefficients of the matrix D representing each of the data SD0, SD1, ..., SDk and the signals DQ0, DQ1, ..., DQh. For example, the differential amplifier 410_0 outputting the differential output signals C0a and C0b used to output SD0 may receive the corresponding signals of the signals DQ0, DQ1, ..., DQh based on the coefficients D00, ..., D0h of the matrix D representing the SD0 and the signals DQ0, DQ1, ..., DQh.

The matrix E and the matrix D may be generated based on Equation 5 so as to satisfy the following conditions.

Condition 1: Components (i.e., entries) of the matrix E and matrix D should be integers
Condition 2: D×E should be a diagonal matrix
Condition 3: The sum of the components of each row of D should be 0
Condition 4: The sum of the absolute values of the components of each column of D should be less than or equal to a threshold value (e.g., 10)

$$zA = D \times (S = XT) \lambda E \times A \quad \text{(Equation 5)}$$

Here, z may be a real number, S may be a gain value matrix (hXh, h is a positive number) of each channel, XT may be a coupling coefficient matrix (hXh) of each channel, and A may be a column vector (kX1, k is a positive number) representing data. Accordingly, S+XT is a matrix in which main diagonal components are signal intensities of each of the plurality of channels, and remaining components are crosstalk intensities by adjacent channels.

In Equation 5, D×S×E×A may be data reconstructed as a real multiple of A, and D×XT×E×A may be a component that interferes with the restored data due to the crosstalk effect of the channels 130.

The components of the matrix D and the matrix E may be calculated so as to minimize the components that interfere with the data in D×XT×E×A. That is, as in Equation 6, the component of the matrix D and the component of the matrix E may be calculated so that the ratio having the maximum value among the ratios of the sum of the absolute values of the components of each row except for the main diagonal components of D×(S+XT)×E×A and the main diagonal components of D×(S+XT)×E×A is minimized.

$$\underset{i}{\text{argminmax}} \frac{\sum_{i \neq j} |c_{ij}|}{c_{ii}} \quad \text{(Equation 6)}$$

Here, c is the component of the matrix C, wherein matrix C=D×(S+XT)×E×A.

Hereinafter, referring to FIGS. 5 to 14, the transmitter and the receiver when transmitting and receiving 7-bit data through 8 channels will be described.

Figure 5:
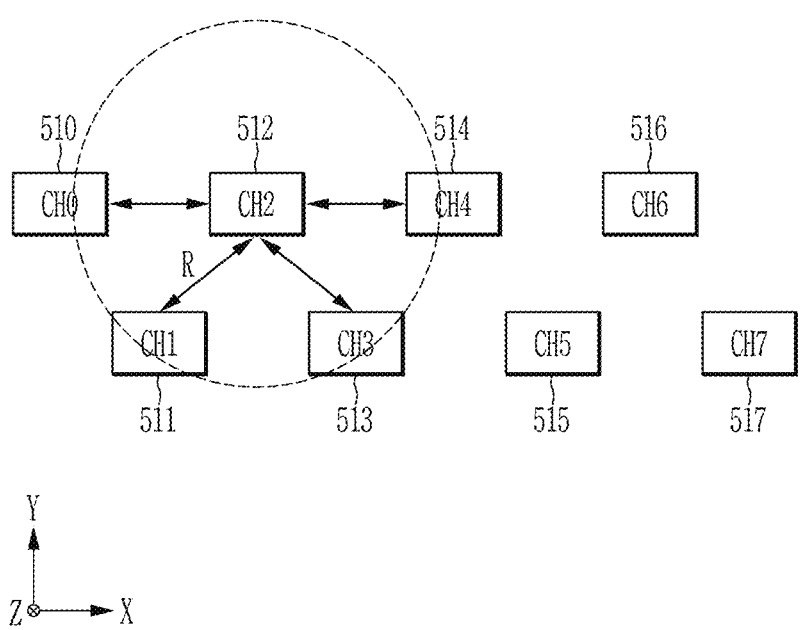
FIG. 5 is a diagram illustrating arrangement of channels according to an example embodiment.

FIG. 5 is a diagram illustrating the arrangement of the channels according to the example embodiment.

Referring to FIG. 5, two adjacent channels among a plurality of channels 510-517 may be spaced apart from each other by the same distance R. The data input/output signal DQ may be transmitted through the plurality of channels 510-517. In each of the plurality of channels 510-517, a crosstalk effect according to a signal transition of adjacent channels may occur. For example, the crosstalk effect may be generated by four adjacent channels 510, 511, 513, and 514 in the channel CH2 512. A crosstalk effect by three adjacent channels 510, 512, and 513 may occur in a channel CH1 511. The crosstalk effect by two adjacent channels 511 and 512 may occur in a channel CH0 510.

Figure 6:
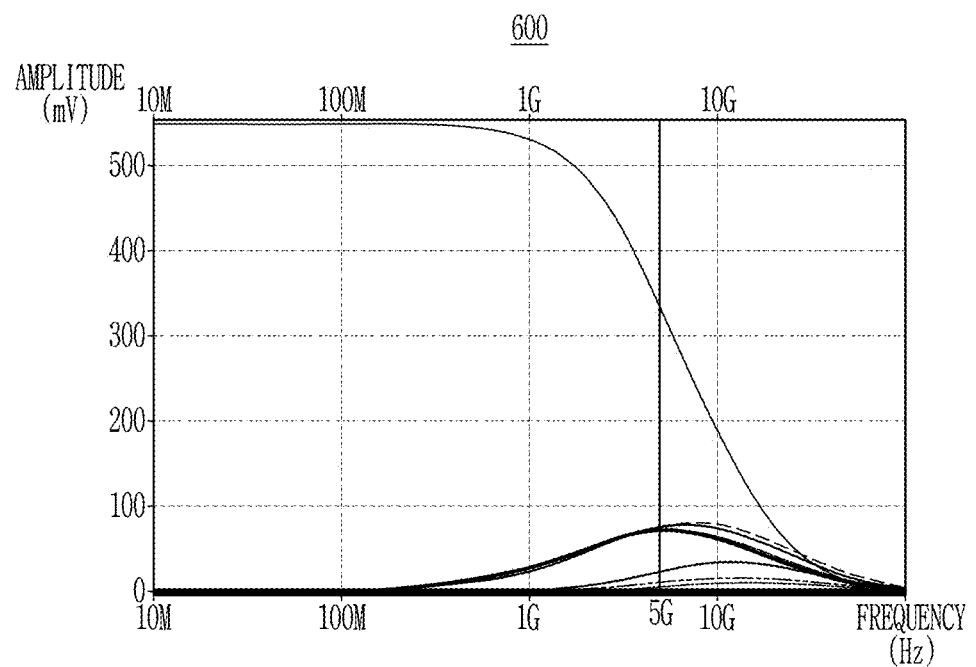
FIG. 6 is a graph illustrating a gain of a signal measured through the channel.

FIG. 6 is a graph illustrating a gain of a signal measured through the channel.

A graph 600 shows strengths of signals transmitted through a channel when a transmission rate is 10 Gbps. A gain value of a target channel (e.g., CH2) measured at a Nyquist frequency (5 GHz) is about 330 m, and gain values according to coupling strengths of channels adjacent to the target channel are measured to be about 75 m. Gain values according to coupling strengths of the remaining channels not adjacent to the target channel are assumed to be 0. Since the channels 510-517 are symmetrically arranged, the gain values measured in the channel CH2, that is, 330 m and 75 m, can be measured for the other channels as well. Based on this, the matrix is expressed as in Equation 7 below.

$$S + XT = \begin{bmatrix} 330 & 75 & 75 & 0 & 0 & 0 & 0 & 0 \\ 75 & 330 & 75 & 75 & 0 & 0 & 0 & 0 \\ 75 & 75 & 330 & 75 & 75 & 0 & 0 & 0 \\ 0 & 75 & 75 & 330 & 75 & 75 & 0 & 0 \\ 0 & 0 & 75 & 75 & 330 & 75 & 75 & 0 \\ 0 & 0 & 0 & 75 & 75 & 330 & 75 & 75 \\ 0 & 0 & 0 & 0 & 75 & 75 & 330 & 75 \\ 0 & 0 & 0 & 0 & 0 & 75 & 75 & 330 \end{bmatrix} \quad \text{(Equation 7)}$$

The matrix of Equation 7 models channel characteristics, that is, the coupling relationship between channels and the strength of mutual influence, and may be divided into a crosstalk component and a signal component as shown in Equations 8 and 9 below.

$$S = \begin{bmatrix} 330 & 0 & 0 & 0 & 0 & 0 & 0 & 0 \\ 0 & 330 & 0 & 0 & 0 & 0 & 0 & 0 \\ 0 & 0 & 330 & 0 & 0 & 0 & 0 & 0 \\ 0 & 0 & 0 & 330 & 0 & 0 & 0 & 0 \\ 0 & 0 & 0 & 0 & 330 & 0 & 0 & 0 \\ 0 & 0 & 0 & 0 & 0 & 330 & 0 & 0 \\ 0 & 0 & 0 & 0 & 0 & 0 & 330 & 0 \\ 0 & 0 & 0 & 0 & 0 & 0 & 0 & 330 \end{bmatrix} \quad \text{(Equation 8)}$$

$$XT = \begin{bmatrix} 0 & 75 & 75 & 0 & 0 & 0 & 0 & 0 \\ 75 & 0 & 75 & 75 & 0 & 0 & 0 & 0 \\ 75 & 75 & 0 & 75 & 75 & 0 & 0 & 0 \\ 0 & 75 & 75 & 0 & 75 & 75 & 0 & 0 \\ 0 & 0 & 75 & 75 & 0 & 75 & 75 & 0 \\ 0 & 0 & 0 & 75 & 75 & 0 & 75 & 75 \\ 0 & 0 & 0 & 0 & 75 & 75 & 0 & 75 \\ 0 & 0 & 0 & 0 & 0 & 75 & 75 & 0 \end{bmatrix} \quad \text{(Equation 9)}$$

Then, according to Equation 6 and condition 1, condition 2, and condition 3, the matrix E and the matrix D may be calculated as in Equation 10 and Equation 11 below.

$$E = \begin{bmatrix} 4 & 0 & -3 & 0 & 0 & 0 & -2 \\ -4 & 0 & -3 & 0 & 0 & 0 & -2 \\ 0 & -4 & 3 & 0 & 0 & 0 & -2 \\ 0 & 4 & 3 & 0 & 0 & 0 & -2 \\ 0 & 0 & 0 & -4 & 0 & -3 & 2 \\ 0 & 0 & 0 & 4 & 0 & -3 & 2 \\ 0 & 0 & 0 & 0 & -4 & 3 & 2 \\ 0 & 0 & 0 & 0 & 4 & 3 & 2 \end{bmatrix} \quad \text{(Equation 10)}$$

$$D = \begin{bmatrix} 4 & -4 & 0 & 0 & 0 & 0 & 0 & 0 \\ 0 & 0 & -4 & 4 & 0 & 0 & 0 & 0 \\ -3 & -3 & 3 & 3 & 0 & 0 & 0 & 0 \\ 0 & 0 & 0 & 0 & -4 & 4 & 0 & 0 \\ 0 & 0 & 0 & 0 & 0 & 0 & -4 & 4 \\ 0 & 0 & 0 & 0 & -3 & -3 & 3 & 3 \\ -2 & -2 & -2 & -2 & 2 & 2 & 2 & 2 \end{bmatrix} \quad \text{(Equation 11)}$$

The sum total of the components of the matrix E and the matrix D may each be 0. Therefore, the DQ output from the output driver 310 satisfies Equation 12 below.

$$\begin{bmatrix} DQ0 \\ DQ1 \\ DQ2 \\ DQ3 \\ DQ4 \\ DQ5 \\ DQ6 \\ DQ7 \end{bmatrix} = \begin{bmatrix} 4 & 0 & -3 & 0 & 0 & 0 & -2 \\ -4 & 0 & -3 & 0 & 0 & 0 & -2 \\ 0 & -4 & 3 & 0 & 0 & 0 & -2 \\ 0 & 4 & 3 & 0 & 0 & 0 & -2 \\ 0 & 0 & 0 & -4 & 0 & -3 & 2 \\ 0 & 0 & 0 & 4 & 0 & -3 & 2 \\ 0 & 0 & 0 & 0 & -4 & 3 & 2 \\ 0 & 0 & 0 & 0 & 4 & 3 & 2 \end{bmatrix} \times \begin{bmatrix} D0 \\ D1 \\ D2 \\ D3 \\ D4 \\ D5 \\ D6 \end{bmatrix} \quad \text{(Equation 12)}$$

In addition, the sampling data SD0-SD6 output from the receiver 400 satisfy Equation 13 below.

$$\begin{bmatrix} SD0 \\ SD1 \\ SD2 \\ SD3 \\ SD4 \\ SD5 \\ SD6 \end{bmatrix} = \begin{bmatrix} 4 & -4 & 0 & 0 & 0 & 0 & 0 & 0 \\ 0 & 0 & -4 & 4 & 0 & 0 & 0 & 0 \\ -3 & -3 & 3 & 3 & 0 & 0 & 0 & 0 \\ 0 & 0 & 0 & 0 & -4 & 4 & 0 & 0 \\ 0 & 0 & 0 & 0 & 0 & 0 & -4 & 4 \\ 0 & 0 & 0 & 0 & -3 & -3 & 3 & 3 \\ -2 & -2 & -2 & -2 & 2 & 2 & 2 & 2 \end{bmatrix} \times \begin{bmatrix} DQ0 \\ DQ1 \\ DQ2 \\ DQ3 \\ DQ4 \\ DQ5 \\ DQ6 \\ DQ7 \end{bmatrix} \quad \text{(Equation 13)}$$

Figure 7:
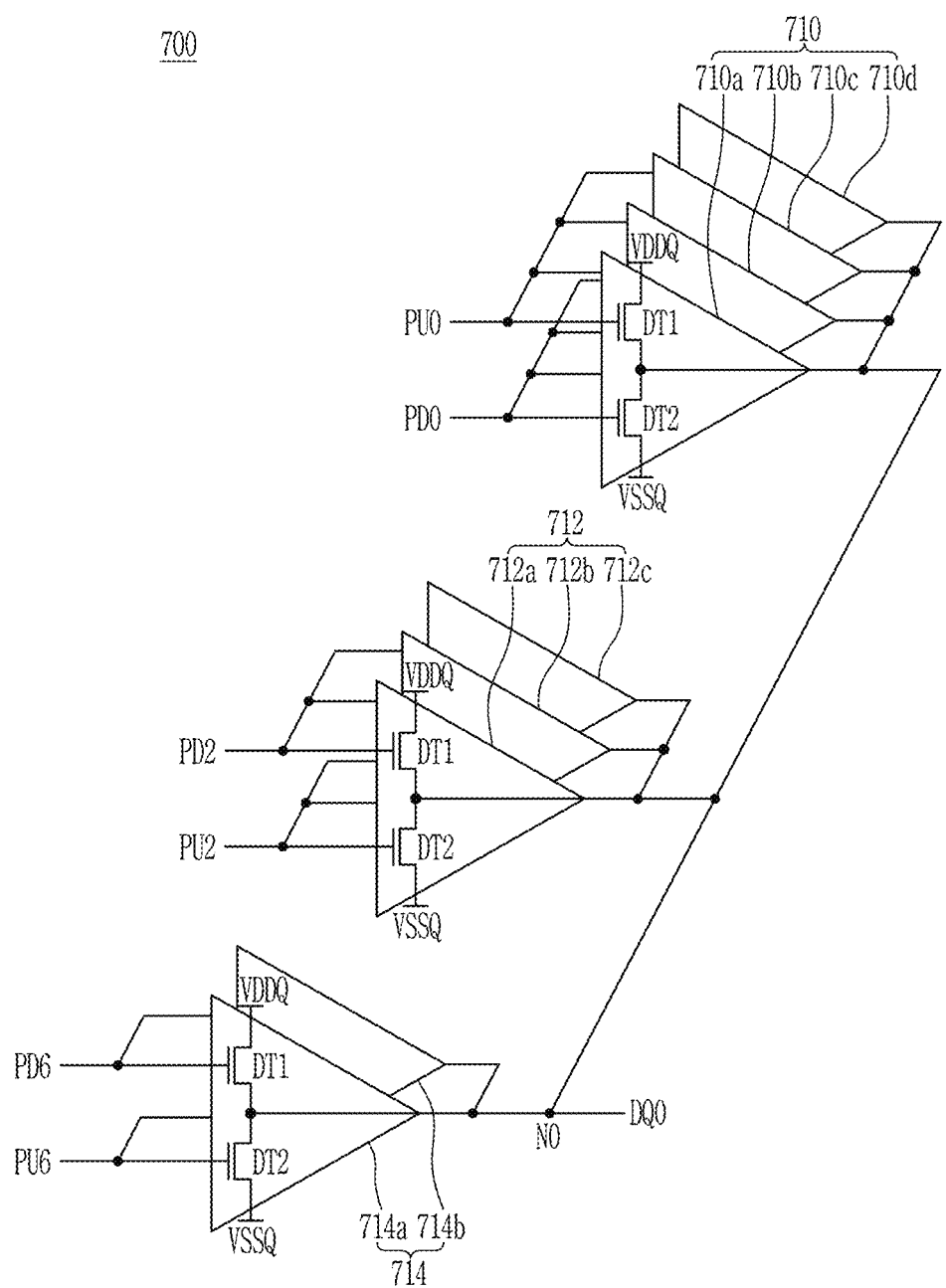
FIG. 7 is a block diagram illustrating a portion of an output driver according to an example embodiment.

FIG. 7 is a block diagram illustrating a portion of the output driver according to the example embodiment.

Referring to FIG. 7, an output driver 700 may correspond to the output driver 285 in FIG. 2. The output driver 700 may output the DQ0. The DQ0 may be generated based on D0, D2, and D6 as in Equation 12. The relationship between DQ0 and D0, D2, and D6 may be expressed as in Equation 14.

$$DQ0 = 4D0 - 3D2 - 2D6 \quad \text{(Equation 14)}$$

According to Equation 14, the output driver 700 may output the data input/output signal DQ0 by emphasizing the data D0, D2, and D6 with intensities according to the components of the matrix E. That is, the data D0, D2, and D6 may be encoded according to Equation 14 and output as the DQ0 through an output node NO.

In an example embodiment, the output driver 700 may include driver groups 710, 712, and 714 that receive the pull-up control signal and the pull-down control signal corresponding to data. For example, the driver group 710 may receive a pull-up control signal PU0 and a pull-down control signal PD0 corresponding to 1-bit data D0 of data to be transmitted.

In some example embodiments, each driver group 710, 712, and 714 may include the number of drivers corresponding to an absolute value of a coefficient multiplied by data. For example, the driver group 710 may include four first drivers 710a, 710b, 710c, and 710d corresponding to coefficient 4 multiplied by the D0 in Equation 14. The drivers 710a, 710b, 710c, and 710d may include a transistor DT1 having one terminal connected to a first power voltage VDDQ and the other terminal connected to the output node NO, and a transistor DT2 having one terminal connected to the output node NO and the other terminal connected to a second power supply voltage VSSQ. The first input terminal of the driver group 710 may be connected to the gate of the transistor DT1 of the drivers 710a, 710b, 710c, and 710d, and the second input terminal may be connected to the gate of the transistor DT2 of the drivers 710a, 710b, 710c, and 710d. The driver group 712 may include three second drivers 712a, 712b, and 712c corresponding to coefficient 3 multiplied by the D2 in Equation 14. The driver group 714 may include two third drivers 714a and 714b corresponding to coefficient 2 multiplied by the D6 in Equation 14.

In some example embodiments, each driver group 710, 712, and 714 may receive the pull-up control signal and the pull-down control signal input to the first input terminal and the second input terminal or receive the pull-up control signal and the pull-down control signal input to the second input terminal and the first input terminal, depending on the sign of the coefficient multiplied by the data. For example, since the sign of the coefficient multiplied by the D0 is positive, the pull-up control signal PU0 is input to the first input terminal of the driver group 710, and since the sign of the coefficient multiplied by the D2 is negative, the pull-up control signal PU2 may be input to the second input terminal of the driver group 712.

Figure 8:
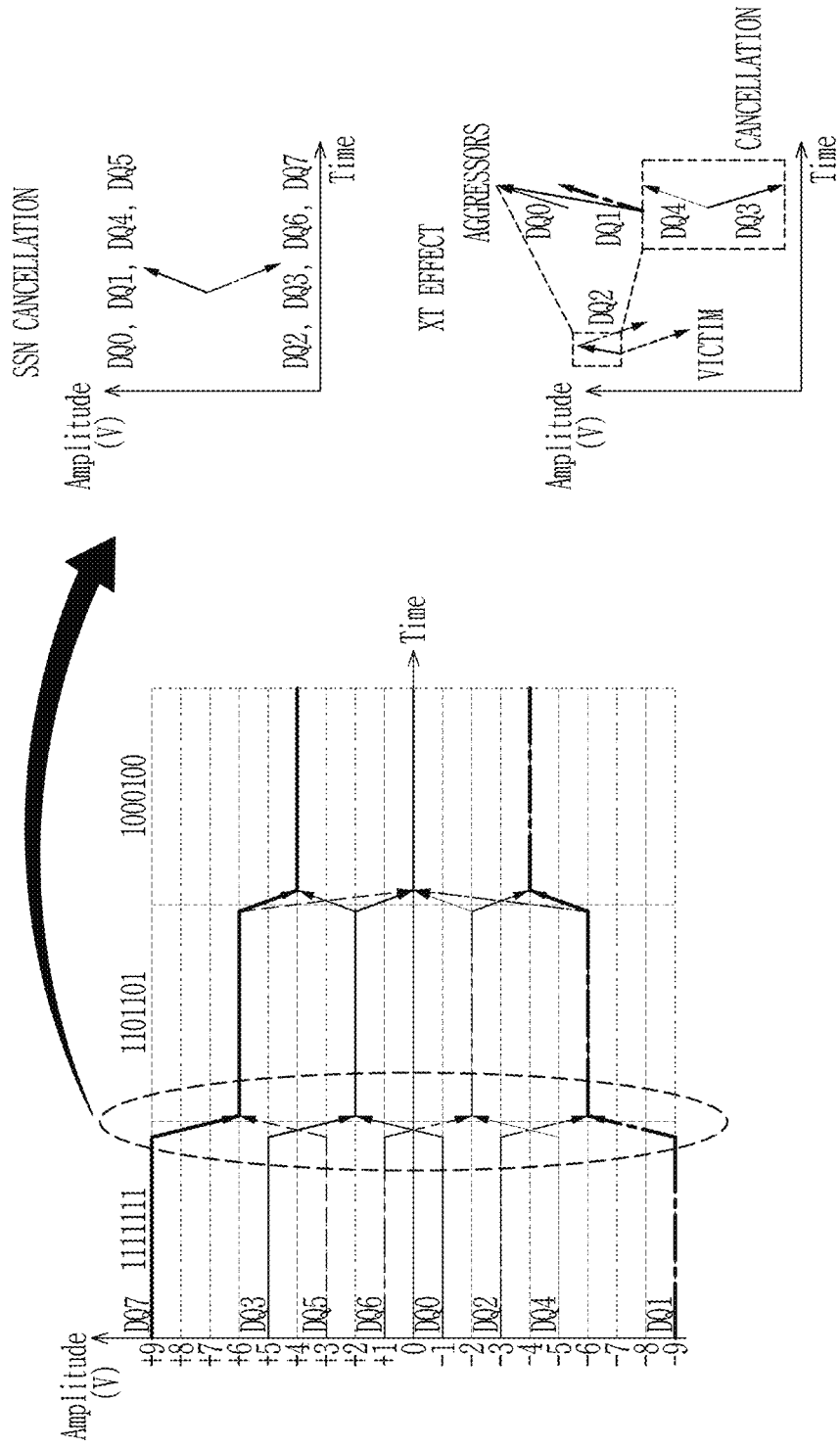
FIG. 8 is a graph illustrating an effect of a signal output from the output driver, SSN, and crosstalk according to an example embodiment.

FIG. 8 is a graph illustrating an effect of a signal output from the output driver, SSN, and crosstalk according to an example embodiment.

Referring to FIG. 8, signal strengths when 7-bit data 11111111, 1101101, and 1000100 are output to the DQ0 to DQ7 in each 1 UI period are illustrated. When 7-bit data 11111111 is output and 7-bit data 1101101 is output, the sum of changes in the DQ0 to DQ7 is 0, so the sum of current flowing through the channels (510-517 in FIG. 5) becomes 0, thereby improving the SSN.

In addition, since some DQ3 and DQ4 of the components (AGGRESSORS) that interfere with the DQ2 transmitted through the channel 512 cancel each other out (CANCELLATION), the crosstalk effect may be reduced.

Figure 9:
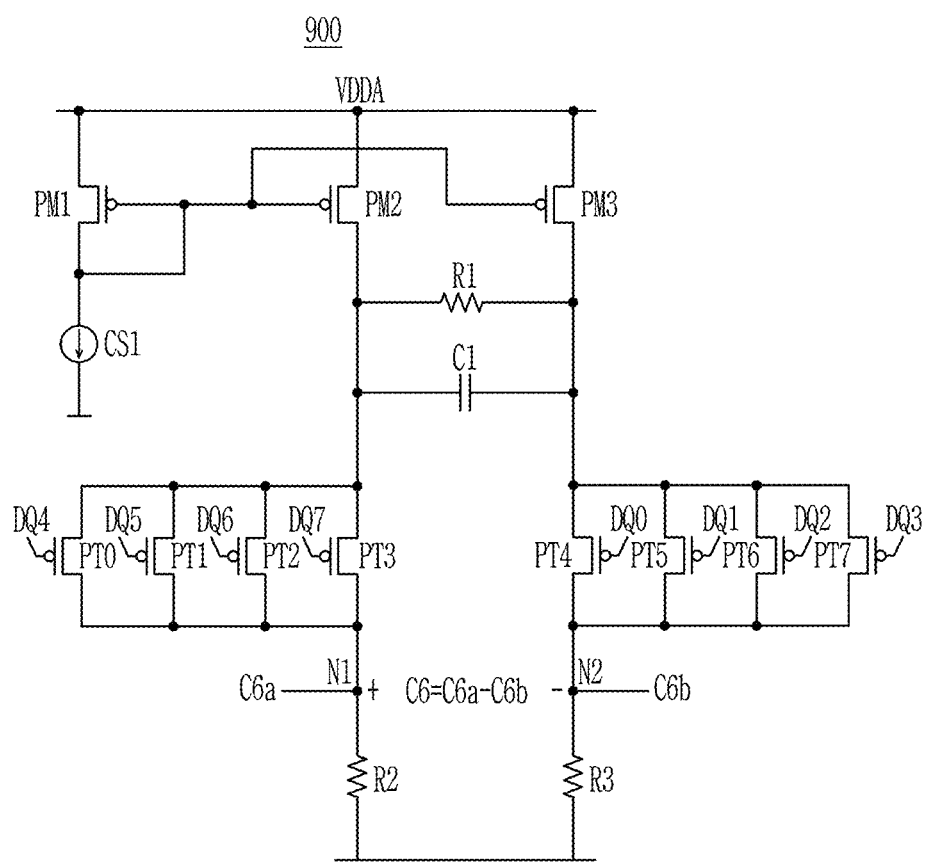
FIG. 9 is a circuit diagram illustrating a differential amplifier of the receiver according to the example embodiment.

FIG. 9 is a circuit diagram illustrating a differential amplifier of the receiver according to the example embodiment.

Referring to FIG. 9, a differential amplifier 900 may be a CTLE. The differential amplifier 900 may output first and second differential output signals C6a and C6b corresponding to the sampling data SD6. As in Equation 13, the sampling data SD6 may be generated based on DQ0-DQ7. The relationship between the SD6 and the DQ0-DQ7 may be expressed as in Equation 15.

$$SD6=-2DQ0-2DQ1-2DQ2-2DQ3+2DQ4+2DQ5+2DQ6+2DQ7 \quad \text{(Equation 15)}$$

That is, the data input/output signals DQ0-DQ7 may be decoded according to Equation 15 and output as first and second differential output signals C6a and C6b.

In an example embodiment, the differential amplifier 900 may include transistors PM1, PM2, and PM3, first input transistors PT0-PT3, second input transistors PT4-PT7, resistors R1, R2, and R3, a capacitor C1, and a current source CS1. The sources of the power transistors PM1, PM2, and PM3 may be connected to a power supply voltage VDDA, and gates of the transistors PM1, PM2, and PM3 and a drain of the transistor PM1 may be connected to the current source CS1. A drain of the transistor PM2 may be connected to one terminal of the resistor R1 and one terminal of the capacitor C1. A drain of the transistor PM3 may be connected to the other terminal of the resistor R1 and the other terminal of the capacitor C1.

Gates of the first input transistors PT0-PT3 may receive the corresponding data input/output signals DQ4-DQ7. Sources of the first input transistors PT0-PT3 may be connected to the drain of the transistor PM2, one terminal of the resistor R1, and one terminal of the capacitor C1, and drains of the first input transistors PT0-PT3 may be connected to the resistor R2 and the first output node N1. Gates of the second input transistors PT4-PT7 may receive the corresponding data input/output signals DQ0-DQ3. Sources of the second input transistors PT4-PT7 may be connected to the drain of the transistor PM3, the other terminal of the resistor R1, and the other terminal of the capacitor C1, and drains of the second input transistors PT4-PT7 may be connected to a resistor R3 and a second output node N2. The first differential output signal C6a may be output from the first output node N1, and the second differential output signal C6b may be output from the second output node N2. The output signal C6 of the differential amplifier 900 may be a difference between the first differential output signal C6a and the second differential output signal C6b.

In an example embodiment, the differential amplifier 900 may include the first input transistors PT0-PT3 and the second input transistors PT4-PT7, the number of which is based on the coefficient multiplied by the data input/output signal. In some example embodiments, the data input/output signal may be received by the first input transistors PT0-PT3 or the second input transistors PT4-PT7 depending on the sign of the coefficient. For example, since the sign of the coefficient multiplied by the DQ0 is negative, the DQ0 may be input to the gate of the second input transistor PT4. Similarly, since the sign of the coefficient multiplied by the DQ4 is positive, the DQ4 may be input to the gate of the first input transistor PT0. In some example embodiments, the number of first and second input transistors PT0-PT7 corresponding to each of the data input/output signals DQ0-DQ7 may be a number corresponding to quotients obtained by dividing the coefficients by the greatest common divisor of the coefficients multiplied by the data input/output signals DQ0-DQ7. For example, since all the coefficients multiplied by the data input/output signals DQ0-DQ7 to decode the sampling data SD6 are equal to 2, and the quotient obtained by dividing 2 by the greatest common divisor 2 is 1, all the number of first and second input transistors corresponding to each of the data input and output signals DQ0DQ7 may be one.

Figure 10:
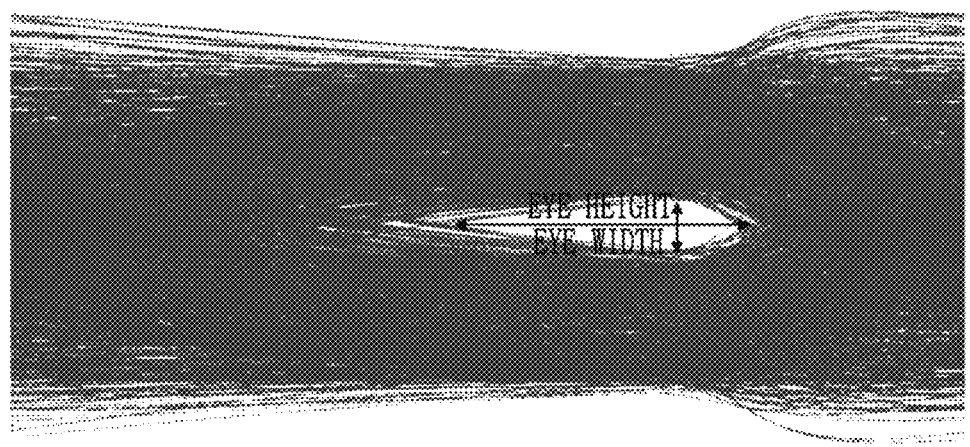
FIG. 10 is an eye diagram of a non-return to zero (NRZ) signal after passing through the channel.
Figure 11:
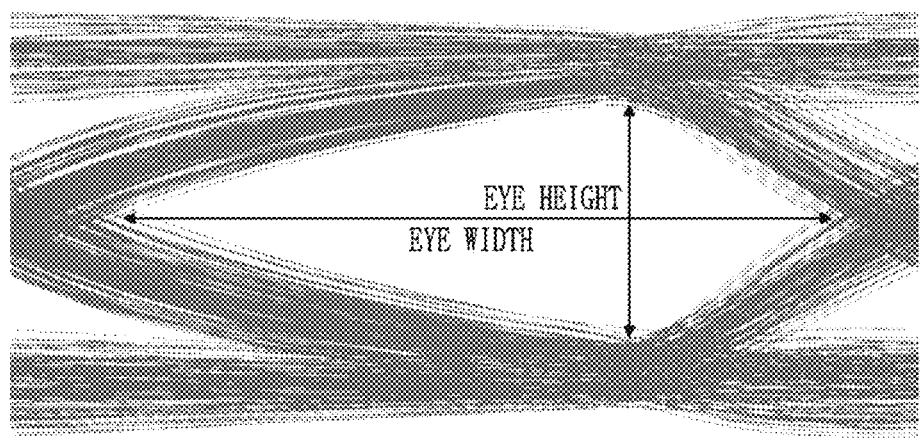
FIG. 11 is an eye diagram of a signal output from the differential amplifier of the receiver according to the example embodiment.

FIG. 10 is an eye diagram of a non-return to zero (NRZ) signal after passing through a channel, and FIG. 11 is an eye diagram of an output signal of a differential amplifier of a receiver according to an example embodiment. An x-axis represents time, and a y-axis represents a level of the received signal.

FIG. 10 illustrates a DQ signal received by a receiver when data is transmitted as an NRZ signal of 8.75 Gbps in a channel not affected by the SSN, and FIG. 11 illustrates the output signal of the differential amplifier of the receiver when data is transmitted at 10 GBaud according to an example embodiment in a channel not affected by the SSN. According to an example embodiment, compared to transmitting 7 data to eight channels, and according to the NRZ method, 7 data are transmitted to 7 channels. Accordingly, for data rate comparison under the same conditions, the NRZ signal when transmitting data at 8.75 Gbps was compared with the signal when transmitting data at 10 GBaud according to an example embodiment. According to an example embodiment, the crosstalk effect is reduced compared to the conventional NRZ method, so the eye width increases by more than 70% and the eye height increases by more than 270%.

Figure 12:
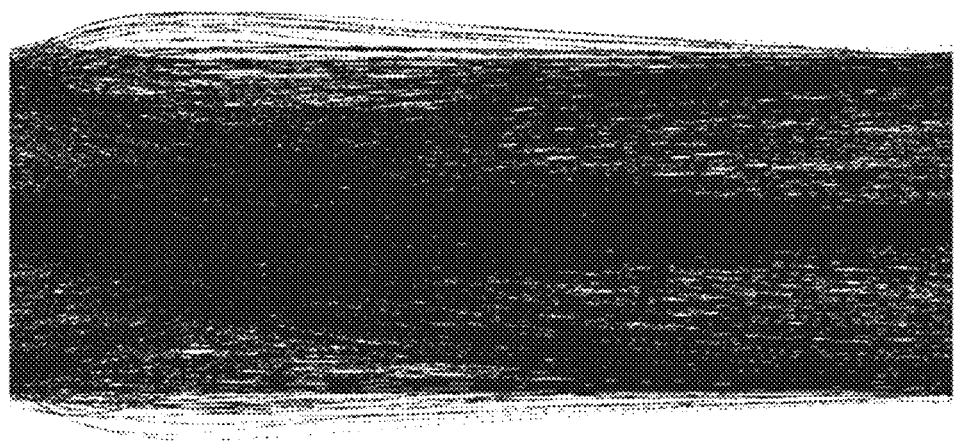
FIG. 12 is the eye diagram of the NRZ signal to which the SSN is added.
Figure 13:
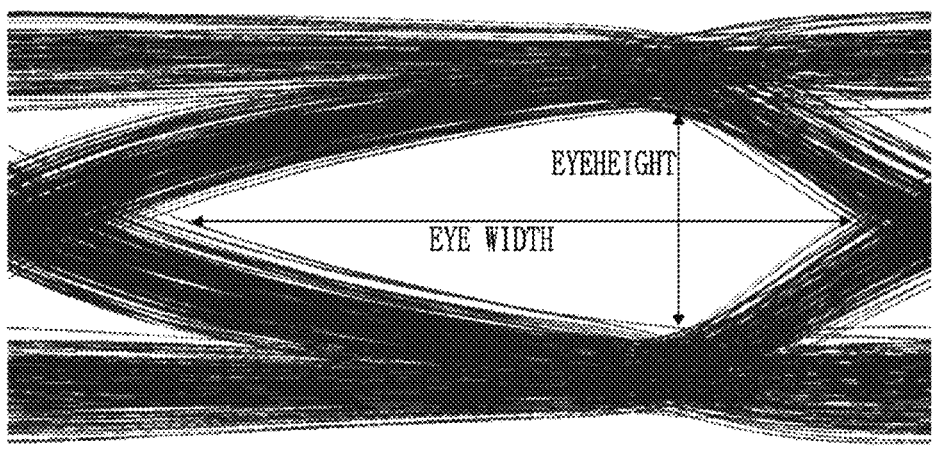
FIG. 13 is an eye diagram of a signal output from the differential amplifier of the receiver according to the example embodiment.

FIG. 12 is an eye diagram of the NRZ signal to which the SSN is added, and FIG. 13 is an eye diagram of an output signal of a differential amplifier of the receiver according to the example embodiment to which the SSN is added.

FIG. 12 illustrates a DQ signal received by a receiver when data is transmitted as an NRZ signal of 8.75 Gbps in a channel affected by the SSN, and FIG. 13 illustrates the output signal of the differential amplifier of the receiver when data is transmitted at 10 GBaud according to an example embodiment in a channel affected by the SSN.

According to the NRZ method in FIG. 12, the eye is completely closed, but since the eye width and the eye height measured in FIG. 13 do not change significantly compared to the eye width and the eye height measured in FIG. 11, the results robust to SSN may be viewed.

Figure 14:
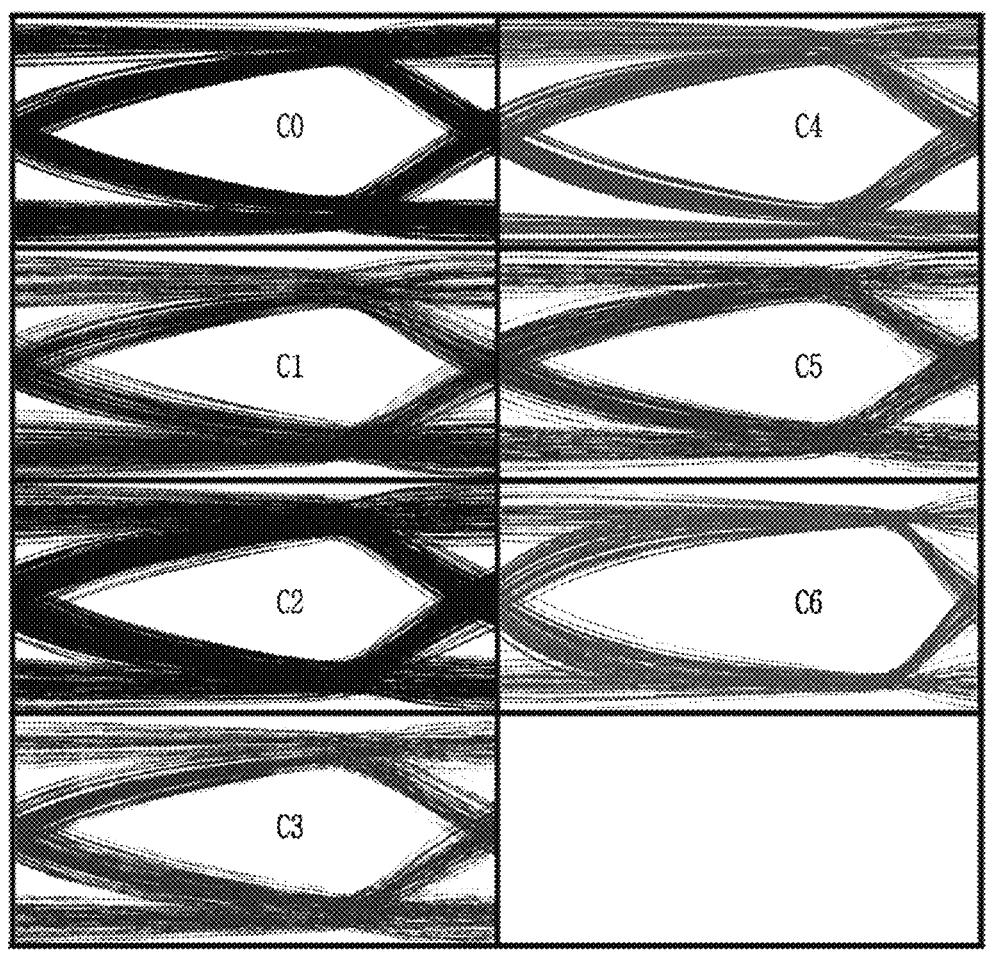
FIG. 14 is the eye diagram of the signal output from the differential amplifier of the receiver according to the example embodiment.

FIG. 14 is the eye diagram of the signal output from the differential amplifier of the receiver according to the example embodiment.

Referring to FIG. 14, the eye width and the eye height of all the seven output signals C0-C6 were measured to be large enough to sample a signal. Accordingly, it is possible to improve signal integrity characteristics of the seven output signals C0-C6.

Hereinafter, referring to FIGS. 15 to 17, the transmitter and the receiver when transmitting and receiving 5-bit data through 6 channels will be described.

Figure 15:
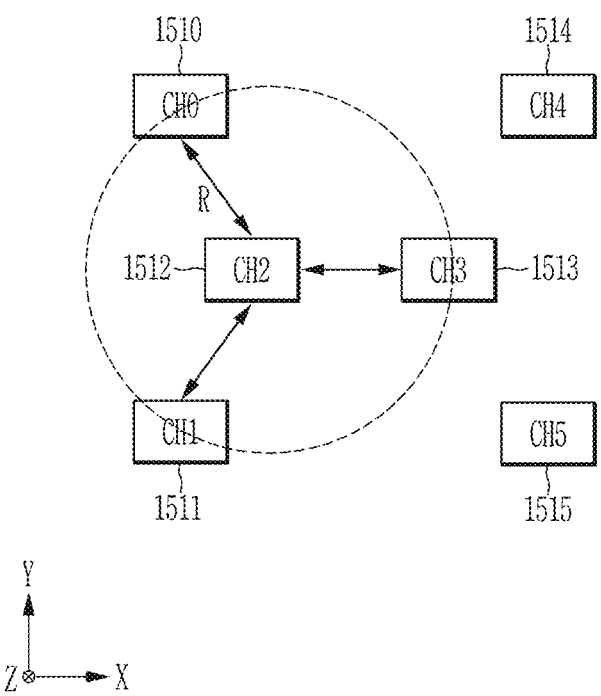
FIG. 15 is a diagram illustrating the arrangement of the channels according to the example embodiment.

FIG. 15 is a diagram illustrating the arrangement of the channels according to an example embodiment.

Referring to FIG. 15, two adjacent channels among a plurality of channels 1510-1515 may be spaced apart from each other by the same distance R. The data input/output signal DQ may be transmitted through the plurality of channels 1510-1515. In each of the plurality of channels 1510-1515, a crosstalk effect according to a signal transition of adjacent channels may occur. For example, a crosstalk effect due to three adjacent channels 1510, 1511, and 1513 may occur in a channel CH2 1512. A crosstalk effect due to one adjacent channel 1512 may occur in the channel CH1 1511.

The matrix E and the matrix D may be calculated as in Equations 16 and 17 below based on gains of signals measured through channels.

$$E = \begin{bmatrix} 2 & -2 & -3 & 0 & 0 \\ 2 & -2 & 3 & 0 & 0 \\ 2 & 4 & 0 & 0 & 0 \\ -2 & 0 & 0 & 4 & 0 \\ -2 & 0 & 0 & -2 & 3 \\ -2 & 0 & 0 & -2 & -3 \end{bmatrix}$$ (Equation 16)

$$D = \begin{bmatrix} 2 & 2 & 2 & -2 & -2 & -2 \\ -2 & -2 & 4 & 0 & 0 & 0 \\ -3 & 3 & 0 & 0 & 0 & 0 \\ 0 & 0 & 0 & 4 & -2 & -2 \\ 0 & 0 & 0 & 0 & 3 & -3 \end{bmatrix}$$ (Equation 17)

The sum total of the components of the matrix E and the matrix D may each be zero. Therefore, the DQ output from the output driver 310 satisfies Equation 18 below.

$$\begin{bmatrix} DQ0 \\ DQ1 \\ DQ2 \\ DQ3 \\ DQ4 \\ DQ5 \end{bmatrix} = \begin{bmatrix} 2 & -2 & -3 & 0 & 0 \\ 2 & -2 & 3 & 0 & 0 \\ 2 & 4 & 0 & 0 & 0 \\ -2 & 0 & 0 & 4 & 0 \\ -2 & 0 & 0 & -2 & 3 \\ -2 & 0 & 0 & -2 & -3 \end{bmatrix} \times \begin{bmatrix} D0 \\ D1 \\ D2 \\ D3 \\ D4 \end{bmatrix}$$ (Equation 18)

In addition, the sampling data SD0-SD6 output from the receiver 400 satisfy Equation 19 below.

$$\begin{bmatrix} SD0 \\ SD1 \\ SD2 \\ SD3 \\ SD4 \end{bmatrix} = \begin{bmatrix} 2 & 2 & 2 & -2 & -2 & -2 \\ -2 & -2 & 4 & 0 & 0 & 0 \\ -3 & 3 & 0 & 0 & 0 & 0 \\ 0 & 0 & 0 & 4 & -2 & -2 \\ 0 & 0 & 0 & 0 & 3 & -3 \end{bmatrix} \times \begin{bmatrix} DQ0 \\ DQ1 \\ DQ2 \\ DQ3 \\ DQ4 \\ DQ5 \end{bmatrix}$$ (Equation 19)

Figure 16:
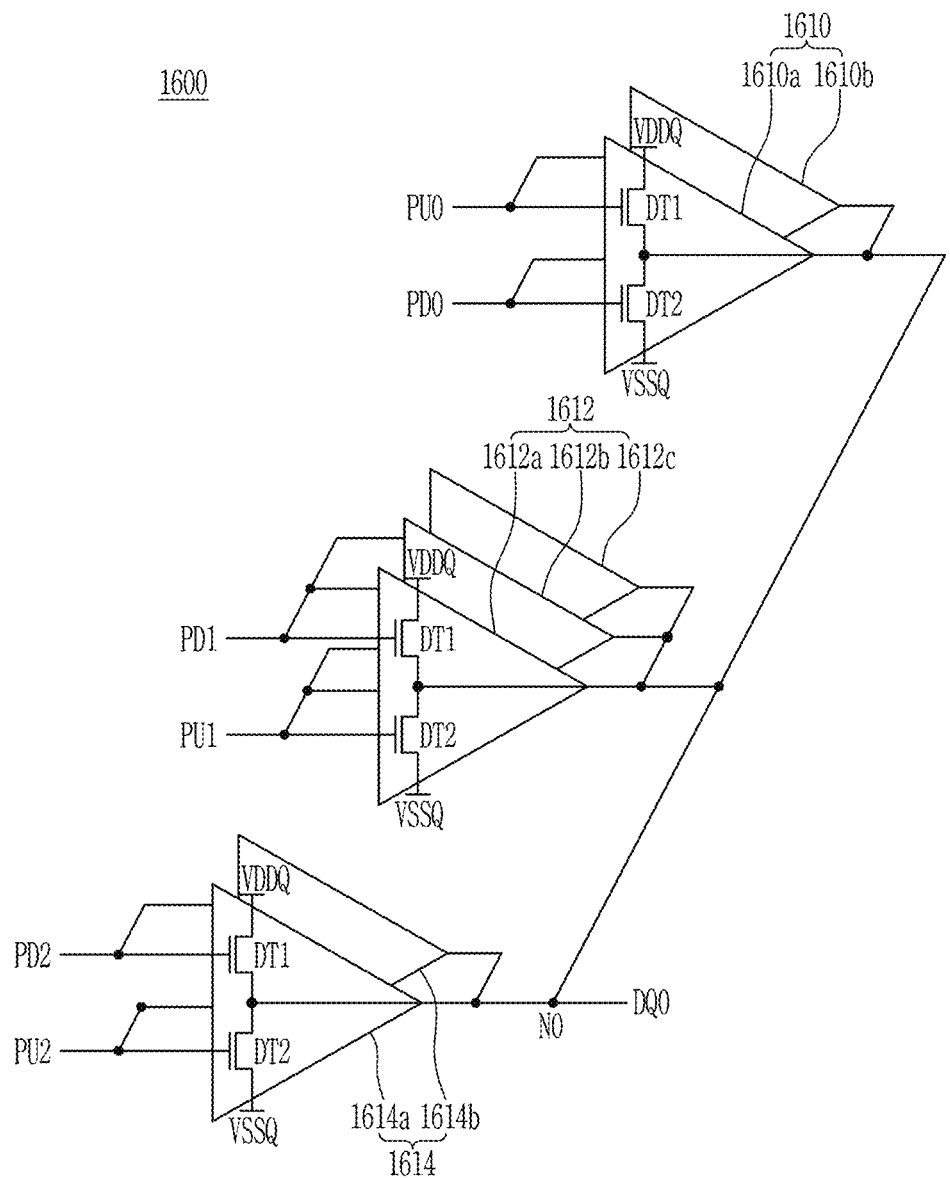
FIG. 16 is a block diagram illustrating a portion of the output driver according to the example embodiment.

FIG. 16 is a block diagram illustrating a portion of an output driver according to an example embodiment.

Referring to FIG. 16, an output driver 1600 may output the DQ0. The DQ0 may be generated based on D0, D1, and D2 as in Equation 18. The relationship between the DQ0 and the D0, D1, and D2 may be expressed as in Equation 20.

$$DQ0 = 2D0 - 3D1 - 2D2$$ (Equation 20)

That is, the data D0, D1, and D2 may be encoded according to Equation 20 and output as the DQ0 through the output node NO.

In an example embodiment, the output driver 1600 may include driver groups 1610, 1612, and 1614 that receive the pull-up control signal and the pull-down control signal corresponding to data. For example, the driver group 1610 may receive a pull-up control signal PU0 and a pull-down control signal PD0 corresponding to 1-bit data D0 of data to be transmitted.

In some example embodiments, each driver group 1610, 1612, and 1614 may include the number of drivers corresponding to an absolute value of a coefficient multiplied by data. For example, the driver group 1610 may include two drivers 1610a and 1610b corresponding to the coefficient 2 multiplied by the D0 in Equation 20. The drivers 1610a and 1610b may include a transistor DT1 having one terminal connected to a first power voltage VDDQ and the other terminal connected to the output node NO, and a transistor DT2 having one terminal connected to the output node NO and the other terminal connected to a second power supply voltage VSSQ. The first input terminal of the driver group 1610 may be connected to the gate of the transistor DT1 of the drivers 1610a and 1610b, and the second input terminal may be connected to the gate of the transistor DT2 of the drivers 1610a and 1610b.

In some example embodiments, each driver group 1610, 1612, and 1614 may receive the pull-up control signal and the pull-down control signal input to the first input terminal and the second input terminal or receive the pull-up control signal and the pull-down control signal input to the second input terminal and the first input terminal, depending on the sign of the coefficient multiplied by the data. For example, since the sign of the coefficient multiplied by the D0 is positive, the pull-up control signal PU0 is input to the first input terminal of the driver group 1610, and since the sign of the coefficient multiplied by the D2 is negative, the pull-up control signal PU2 may be input to the second input terminal of the driver group 1612.

Figure 17:
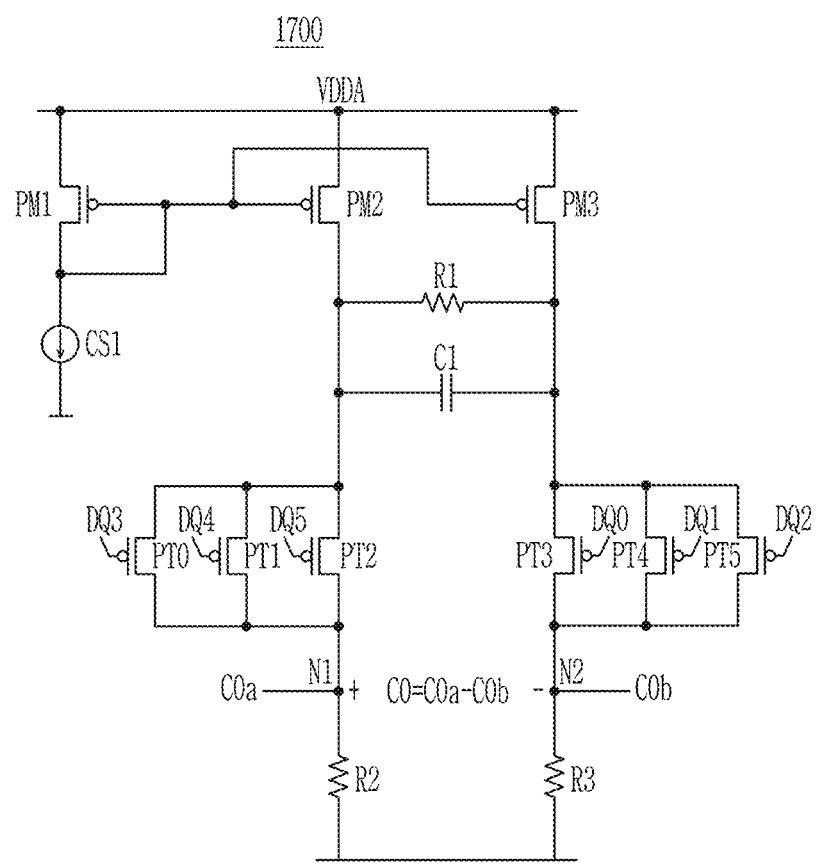
FIG. 17 is a circuit diagram illustrating the differential amplifier of the receiver according to the example embodiment.

FIG. 17 is a circuit diagram illustrating a differential amplifier of the receiver according to an example embodiment.

Referring to FIG. 17, a differential amplifier 1700 may be a CTLE. The differential amplifier 1700 may output the first and second differential output signals C6a and C6b corresponding to the sampling data SD0. As in Equation 19, the sampling data SD6 may be generated based on DQ0-DQ5. The relationship between the SD0 and the DQ0DQ5 may be expressed as in Equation 21.

$$SD6 = 2DQ0 + 2DQ1 + 2DQ2 - 2DQ3 - 2DQ4 - 2DQ5$$ (Equation 21)

That is, the data input/output signals DQ0-DQ5 may be decoded according to Equation 21 and output as the first and second differential output signals C6a and C6b.

In an example embodiment, the differential amplifier 1700 may include the transistors PM1, PM2, and PM3, the first input transistors PT0, PT1, and PT2, the second input transistors PT3, PT4, and PT5, the resistors R1, R2, and R3, the capacitor C1, and the current source CS1. The sources of the power transistors PM1, PM2, and PM3 may be connected to a power supply voltage VDDA, and gates of the transistors PM1, PM2, and PM3 and a drain of the transistor PM1 may be connected to the current source CS1. The current source CS1 may generate a bias current flowing through the transistor PM2 and a bias current flowing through the power transistor PM2. The drain of the transistor PM2 may be connected to one terminal of the resistor R1 and one terminal of the capacitor C1. The drain of the transistor PM3 may be connected to the other terminal of the resistor R1 and the other terminal of the capacitor C1.

The gates of the first input transistors PT0, PT1, and PT2 may receive the corresponding data input/output signals DQ3, DQ4, and DQ5. The sources of the first input transistors PT0, PT1, and PT2 may be connected to the drain of the transistor PM2, one terminal of the resistor R1, and one terminal of the capacitor C1, and the drains of the first input transistors PT0, PT1, and PT2 may be connected to the resistor R2 and the first output node N1. The gates of the second input transistors PT3, PT4, and PT5 may receive the corresponding data input/output signals DQ0, DQ1, and DQ2. The sources of the second input transistors PT3, PT4, and PT5 may be connected to the drain of the transistor PM3, the other terminal of the resistor R1, and the other terminal of the capacitor C1, and the drains of the second input transistors PT3, PT4, and PT5 may be connected to the resistor R3 and the second output node N2. The first differential output signal C0a may be output from the first output node N1, and the second differential output signal C0b may be output from the second output node N2. The output signal C0 of the differential amplifier 1700 may be a difference between the first differential output signal C0a and the second differential output signal C0b.

In an example embodiment, the differential amplifier 1700 may include the first input transistors PT0, PT1, and PT2 and the second input transistors PT3, PT4, and PT5, the number of which is based on the coefficient multiplied by the data input/output signal. In some example embodiments, the data input/output signal may be received by the first input transistors PT0, PT1, and PT2 or the second input transistors PT3, PT4, and PT5 depending on the sign of the coefficient. For example, since the sign of the coefficient multiplied by the DQ0 is negative, the DQ0 may be input to the gate of the second input transistor PT3. Similarly, since the sign of the coefficient multiplied by the DQ3 is positive, the DQ3 may be input to the gate of the first input transistor PT0. In some example embodiments, the number of first and second input transistors PT0-PT5 corresponding to each of the data input/output signals DQ0-DQ5 may be a number corresponding to quotients obtained by dividing the coefficients by the greatest common divisor of the coefficients multiplied by the data input/output signals DQ0-DQ5. For example, since all the coefficients multiplied by the data input/output signals DQ0-DQ5 to decode the sampling data SD0 are equal to 2, and the quotient obtained by dividing 2 by the greatest common divisor 2 is 1, all the number of first and second input transistors corresponding to each of the data input and output signals DQ0-DQ5 may be one.

Figure 18:
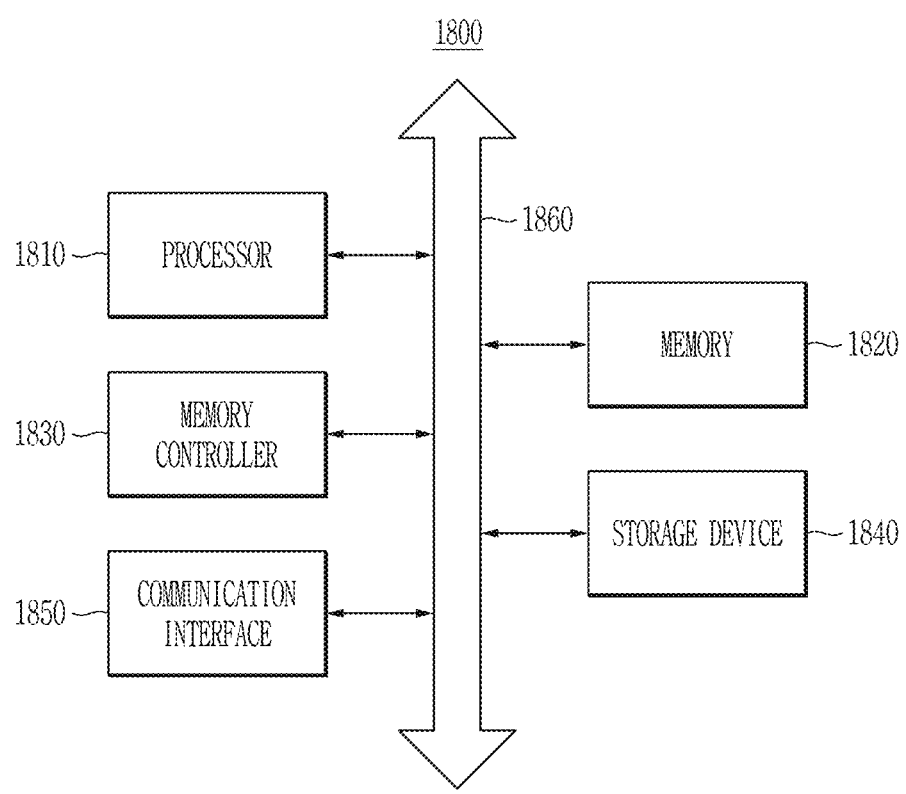
FIG. 18 is a block diagram of a computer system according to an example embodiment.

FIG. 18 is an example block diagram of a computer system according to an example embodiment.

Referring to FIG. 18, a computing system 1800 includes a processor 1810, a memory 1820, a memory controller 1830, a storage device 1840, a communication interface 1850, and a bus 1860. The computing system 1800 may further include other general-purpose components.

The processor 1810 controls the overall operation of each component of the computing system 1800. The processor 1810 may be implemented as at least one of various processing units such as a central processing unit (CPU), an application processor (AP), and a graphic processing unit (GPU).

The memory 1820 stores various data and commands. The memory 1820 may be implemented as a memory device described with reference to FIGS. 1 to 17. The memory controller 1830 controls the transfer of data or commands to and from the memory 1820. The memory controller 1830 may be implemented as the memory controller described with reference to FIGS. 1 to 17. In some example embodiments, the memory controller 1830 may be provided as a separate chip from the processor 1810. In some example embodiments, the memory controller 1830 may be provided as an internal component of the processor 1810. Each of the memory 1820 and the memory controller 1830 may encode a data input/output signal transmitted to a target channel based on a plurality of data and decode data based on a plurality of data input/output signals received through a plurality of channels. Each of the memory 1820 and the memory controller 1830 may amplify a plurality of data based on the coefficients of the matrix E derived to satisfy Equation 5 and Conditions 1 to 4, and output the amplified data as a data input/output signal. Each of the memory 1820 and the memory controller 1830 may differentially amplify a plurality of data input and output signals based on the coefficients of the matrix D derived to satisfy Equation 5 and Conditions 1 to 4, and output the amplified signal as the data input/output signal.

The storage device 1840 non-temporarily stores programs and data. In some example embodiments, the storage device 1840 may be implemented as a non-volatile memory. The communication interface 1850 supports wired and wireless Internet communication of the computing system 1800. In addition, the communication interface 1850 may support various communication methods other than the Internet communication. The bus 1860 provides a communication function between components of the computing system 1800. The bus 1360 may include at least one type of bus depending on the communication protocol between the components.

In some example embodiments, each component or combination of two or more components described with reference to FIGS. 1 to 18 may be implemented as a digital circuit, programmable or programmable logic device or array, application specific integrated circuit, ASIC), etc.

Although the example embodiment of the present invention has been described in detail hereinabove, the scope of the present invention is not limited thereto. That is, several modifications and alterations made by a person of ordinary skill in the art using a basic concept of the present invention as defined in the claims fall within the scope of the present invention.

What is claimed is:

1. A semiconductor system, comprising:
 a transmitter configured to output a plurality of data as a plurality of data input/output signals through a plurality of channels based on a matrix E; and a receiver configured to generate the plurality of data by differentially amplifying the plurality of data input/output signals received through the plurality of channels based on a matrix D, all components of the matrix E and the matrix D being integers, a product matrix of the matrix D and the matrix E being a diagonal matrix, a sum of the components of each row of the matrix D being 0, and a sum of absolute values of the components of each column of the matrix D being less than or equal to a threshold value.

2. The semiconductor system of claim 1, wherein:
the components of the matrix D and the components of the matrix E are calculated according to the formula below, $$\underset{i}{\mathrm{argminmax}} \frac{\sum_{i \neq j} |c_{ij}|}{c_{ij}}$$

where C=D×(S+XT)×E×A, and
wherein, D is the matrix D, E is the matrix E, A is a column vector including the plurality of data, and S+XT is a matrix in which main diagonal components are signal intensities of each of the plurality of channels, and remaining components are crosstalk intensities by adjacent channels.

3. The semiconductor system of claim 1, wherein:
the transmitter includes a plurality of driver groups outputting the plurality of data input/output signals, and
a first driver group outputting a first data input/output signal among the plurality of data input/output signals through a first channel among the plurality of channels includes, among the components of the matrix E corresponding to the first data input/output signal, first drivers of a first number based on absolute values of components corresponding to first data among the plurality of data and among the components of the matrix E corresponding to the first data input/output signal, second drivers of a second number based on absolute values of components corresponding to second data among the plurality of data.

4. The semiconductor system of claim 3, wherein:
each of the first drivers of the first number includes
a first pull-up transistor configured to connect a first output node connected to the first channel and a first power supply voltage based on one of a first pull-up control signal and a first pull-down control signal generated based on the first data; and a first pull-down transistor configured to connect the first output node and a second power supply voltage based on the other of the first pull-up control signal and the first pull-down control signal.

5. The semiconductor system of claim 4, wherein:
among the components of the matrix E corresponding to the first data input/output signal, the first pull-up control signal is applied to a gate of the first pull-up transistor and the first pull-down control signal is applied to the gate of the first pull-down transistor, or the first pull-up control signal is applied to the gate of the first pull-down transistor and the first pull-down control signal is applied to the gate of the first pull-up transistor, depending on a sign of the component corresponding to the first data among the plurality of data.

6. The semiconductor system of claim 5, wherein the transmitter further includes a pre-driver configured to generate the first pull-up control signal and the first pull-down control signal based on the first data.

7. The semiconductor system of claim 4, wherein:
each of the second drivers of the second number includes
a second pull-up transistor configured to connect the first output node and the first power supply voltage based on one of a second pull-up control signal and a second pull-down control signal generated based on the second data and a second pull-down transistor configured to connect the first output node and the second power supply voltage based on the other of the second pull-up control signal and the second pull-down control signal.

8. The semiconductor system of claim 3, wherein the first number and the second number may be different from each other.

9. The semiconductor system of claim 3, wherein the first number and the second number may be the same as each other.

10. The semiconductor system of claim 1, wherein:
a sum total of changes of the plurality of data input/output signals in the plurality of channels is 0.

11. The semiconductor system of claim 3, wherein:
the receiver includes at least one first transistor configured to electrically connect a power supply voltage and a first node, at least one second transistor configured to electrically connect the power supply voltage and a second node, and a differential amplifier configured to output a voltage of the first node and a voltage of the second node.

12. The semiconductor system of claim 11, wherein:
when the sign of the component corresponding to the first data input/output signal among the components of the matrix D corresponding to the first data among the plurality of data is positive, the first data input/output signal is applied to the gate of the at least one first transistor, and
when the sign of the component corresponding to the first data input/output signal among the components of the matrix D corresponding to the first data among the plurality of data is negative, the first data input/output signal is applied to the gate of the at least one second transistor.

13. The semiconductor system of claim 11, wherein:
the number of at least one first transistors is based on an absolute value of a component corresponding to the first data input/output signal among the components of the matrix D corresponding to the first data among the plurality of data, and
the number of at least one second transistors is based on an absolute value of a component corresponding to the second data input/output signal among the components of the matrix D corresponding to the first data among the plurality of data.

14. A memory device, comprising:
a memory cell array; and
a transmitter configured to receive n (n is a natural number) data from the memory cell array, and emphasizes the n data with intensities according to components of a matrix E to generate n+1 data input/output signals, in which a sum of the components of the matrix E is 0.

15. The memory device of claim 14, wherein the transmitter includes:
at least one first driver each of which includes a first pull-up transistor connecting a first output node connected to a first channel among a plurality of channels to a first power supply voltage based on one of a first pull-up control signal and a first pull-down control signal based on first data among n data and a first pull-down transistor connecting the first output node and a second power supply voltage based on the other of the first pull-up control signal and the first pull-down control signal; and at least one second driver each of which includes a second pull-up transistor connecting a first output node and a first power supply voltage based on one of a second pull-up control signal and a second pull-down control signal based on second data among the n data and a second pull-down transistor connecting the first output node and the second power supply voltage based on the other of the second pull-up control signal and the second pull-down control signal.

16. The memory device of claim 15, wherein the first pull-up control signal is applied to a gate of the first pull-up transistor, and the first pull-down control signal is applied to a gate of the first pull-down transistor.

17. The memory device of claim 15, wherein the second pull-down control signal is applied to a gate of the second pull-up transistor, and the second pull-up control signal is applied to a gate of the second pull-down transistor.

18. The memory device of claim 15, wherein the number of at least one first driver and the number of at least one second driver is different from each other.

19. The memory device of claim 15, wherein the number of at least one first driver and the number of at least one second driver is the same as each other.

20. A memory system comprising:
a memory device configured to include a memory cell array and a transmitter encoding n data into n+1 data input/output signals and outputting the n+1 data input/output signals; and
a memory controller configured to include a receiver receiving the n+1 data input/output signals and decoding n data by differentially amplifying the n+1 data input/output signals according to components of a matrix D, in which a sum of the components of the matrix D is 0.

* * * * *